US010365708B2

(12) United States Patent
Peffers et al.

(10) Patent No.: US 10,365,708 B2
(45) Date of Patent: Jul. 30, 2019

(54) SYSTEMS AND METHODS FOR GUARDBAND RECOVERY USING IN SITU CHARACTERIZATION

(71) Applicant: Intel Corporation, Santa Clara, CA (US)

(72) Inventors: Simon N. Peffers, Acton, MA (US); Sean M. Gulley, Boston, MA (US); Thomas L. Dmukauskas, Somerville, MA (US); Aaron Gorius, Upton, MA (US); Vinodh Gopal, Westborough, MA (US)

(73) Assignee: Intel Corporation, Santa Clara, CA (US)

( * ) Notice: Subject to any disclaimer, the term of this patent is extended or adjusted under 35 U.S.C. 154(b) by 247 days.

(21) Appl. No.: 15/379,283

(22) Filed: Dec. 14, 2016

(65) Prior Publication Data

US 2018/0164864 A1    Jun. 14, 2018

(51) Int. Cl.

| *G06F 11/24* | (2006.01) |
|---|---|
| *G06F 1/3296* | (2019.01) |
| *G01R 31/28* | (2006.01) |
| *G06F 1/324* | (2019.01) |
| *G06F 1/3206* | (2019.01) |

(52) U.S. Cl.
CPC ....... *G06F 1/3296* (2013.01); *G01R 31/2874* (2013.01); *G01R 31/2879* (2013.01); *G06F 1/324* (2013.01); *G06F 1/3206* (2013.01); *G06F 11/24* (2013.01); *Y02D 10/126* (2018.01); *Y02D 10/172* (2018.01)

(58) Field of Classification Search
CPC ....................................... G06F 11/24
See application file for complete search history.

(56) References Cited

U.S. PATENT DOCUMENTS

| 2012/0023382 | A1* | 1/2012 | Sandhu | ................... | G06F 1/324 |
| | | | | | 714/734 |
| 2017/0357311 | A1* | 12/2017 | Hovis | ..................... | G06F 11/24 |

\* cited by examiner

*Primary Examiner* — Albert Wang
(74) *Attorney, Agent, or Firm* — Nicholson De Vos Webster & Elliott, LLP

(57) ABSTRACT

Methods and apparatuses related to guardband recovery using in situ characterization are disclosed. In one example, a system includes a target circuit, a voltage regulator to provide a variable voltage to, a phase-locked loop (PLL) to provide a variable clock to, and a temperature sensor to sense a temperature of the target circuit, and a control circuit, wherein the control circuit is to set up a characterization environment by setting a temperature, voltage, clock frequency, and workload of the target circuit, execute a plurality of tests on the target circuit, when the target circuit passes the plurality of tests, adjust the variable voltage to increase a likelihood of the target circuit failing the plurality of tests and repeat the plurality of tests, and when the target circuit fails the plurality of tests, adjust the variable voltage to decrease a likelihood of the target circuit failing the plurality of tests.

20 Claims, 12 Drawing Sheets

US 10,365,708 B2

SYSTEMS AND METHODS FOR GUARDBAND RECOVERY USING IN SITU CHARACTERIZATION

TECHNICAL FIELD

Embodiments described herein generally relate to dynamic power management of computing devices. Embodiments described generally relate to systems and methods for guardband recovery using in situ characterization.

BACKGROUND INFORMATION

There are many factors that affect the performance of silicon chips (CPUs, ASICs). Operating voltage affects the speed of transistors, with higher voltage switching faster but consuming more energy and lower voltage switching slower but consuming less energy. Random silicon variation from die to die affects the speed of silicon, power consumption, and minimum operating voltage. Temperature affects the switching speed of transistors as well. At typical operating voltages on modern silicon fabrication technologies, hot transistors switch faster but leak more energy while cool transistors switch slower but leak less energy.

As a result, for each silicon chip there are optimal operating points for temperature, voltage, and clock frequency (speed) that maximize either performance or performance per watt. Understanding and operating at the ideal point for each silicon chip results in higher return on investment (ROI) over the life of the chip.

BRIEF DESCRIPTION OF THE DRAWINGS

The various advantages of the embodiments disclosed herein will become apparent to one skilled in the art by reading the following specification and appended claims, and by referencing the drawings, in which:

DETAILED DESCRIPTION OF THE EMBODIMENTS

Figure 1:
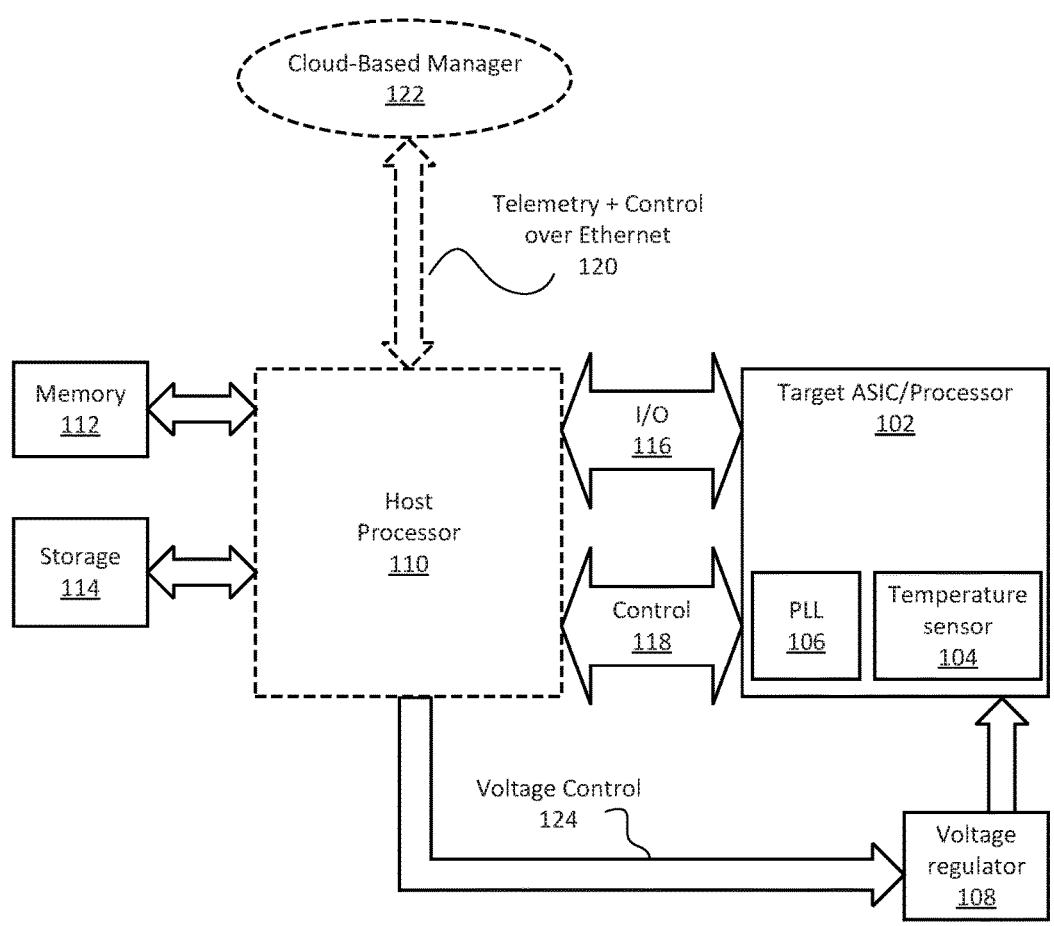
FIG. 1 is a block diagram illustrating a system in which at least some guardband is recovered using in situ characterization, according to some embodiments.

In the following description, numerous specific details are set forth. However, it is understood that embodiments of the disclosure are practiced without these specific details. In other instances, well-known circuits, structures and techniques have not been shown in detail to not obscure the understanding of this description.

References in the specification to "one embodiment," "an embodiment," "an example embodiment," etc., indicate that the embodiment described includes a feature, structure, or characteristic, but every embodiment does not necessarily include the feature, structure, or characteristic. Moreover, such phrases are not necessarily referring to the same embodiment. Further, when a feature, structure, or characteristic is described about an embodiment, it is submitted that it is within the knowledge of one skilled in the art to affect such feature, structure, or characteristic about other embodiments whether explicitly described.

There are many factors that affect the performance of silicon chips (CPUs, ASICs). Circuit performance is affected by operating voltage, temperature, random silicon variation from die to die, to name a few. As a result, for each silicon chip there are optimal operating points for temperature, voltage, and clock frequency (speed) that maximize performance, performance per watt, or power consumption. Understanding and operating at the ideal point for each silicon chip results in higher ROI over the life of the chip. A problem that is faced is that the operating environment of silicon chips after manufacture is not known.

Some attempt to solve this problem by characterizing a sample of chips using a subset of use cases during manufacturing to determine a set point for an operational environment for a chip, then applying a guardband to cover the range of expected variations in process, temperature and customer use cases. This guardband, however, can be overly conservative, and result in suboptimal performance and power utilization.

Embodiments disclosed herein allow at least some guardband recovery using in situ characterization. A less conservative guardband is applied, reducing the amount of power or performance that would be sacrificed by an overly conservative guardband.

Embodiments disclosed herein recover most of this guardband by characterizing chips individually in situ (i.e. in the actual conditions in which they will operate). As conditions change, the characterization is repeated.

Guardbands at Issue

Embodiments herein are relevant to several different types of guardbands applied after manufacturing testing:

ITD guardband (Inverse Temperature Dependency): several units are tested at cooler temperatures to determine how much of a voltage increase is required for a chip to operate when the chip is cooler. The number of units tested may be, for example, all of the die manufactured on a single wafer. There are more than 100 die on a wafer in the case of a 300 mm wafer on which 22 mm by 23 mm processor die are manufactured. There are more than 250 such die on a 450 mm wafer. The ITD guardband may be set at an overly conservative level during manufacture because it is determined by the most temperature-sensitive unit in the lot, but is applied to all units.

The quality guardband relates to the uncertainty that the test vectors used in manufacturing test represent the universe of applications that customers use. The quality guardband is a number that is derived from a sample of units that go through characterization in a customer-like environment and in the manufacturing test environment. Statistical analysis between the minimum operating voltages in the two environments determines the quality guardband. The quality guardband may be overly conservative to the extent that the actual operating environment differs from the manufacturing test environment and the customer-like environment.

The reliability guardband relates to the degradation in switch time of transistors over their lifetime of use. This value is determined by accelerated life test Vmin measurements on a sample of units, and a statistical analysis employed over the degradation distribution such that one guardband is selected to cover all units. The reliability guardband may be overly conservative to the extent the one guardband is selected to cover all units.

VR Tolerance Band is a guardband applied to reflect that a CPU will be placed in a customer system with a specific voltage regulator chip. The VR tolerance guardband is a function of the guardband specification for the specific voltage regulator chip. The VR tolerance band may be overly conservative to the extent that every CPU would be placed in a system with a VR operating at the worst edge of its specification.

In some embodiments, an in situ characterization process is run at boot time and periodically during operation to ascertain a minimum voltage for operation ($V_{min}$) for an individual silicon chip. The process begins with setting up an operating environment, including temperature, voltage, clock frequency, and workload levels, for a target silicon chip to levels at which the target silicon chip is expected to pass. The control circuit then tests the target circuit while gradually adjusting at least one operating environment variable until a point of failure is reached, and then sets a new, less-conservative guardband for that operating environment variable. In some embodiments, the new, less conservative guardband comprises a backoff from a point of failure.

Periodically repeating this process, in situ, and in the course of normal operation, can allow the silicon chip to operate without sacrificing power and performance by using overly conservative guardbands that were set during manufacturing. In some embodiments, the in situ characterization is conducted on a daily basis during normal operation. In some embodiments, the in situ characterization is repeated every hour during normal operation. In some embodiments, the in situ characterization is conducted every five minutes during normal operation. In other words, the in situ characterization process can be repeated often. As used herein, in situ characterization is sometimes referred to as training.

Periodically repeating the training or in situ characterization allows the system to adapt to changes in both intrinsic and external parameters over time. Intrinsic parameters that affect the system can change, such as climate, airflow (which affects temperature), workloads or silicon aging. As this happens the ideal optimization point for the system, including the selected voltage and clock frequency, is likely to change as well. For example, aged silicon may run slower, leading to a selection of a lower optimal clock speed. The cost of electricity is one example of an external parameter affecting the system optimization point, and could trigger a retraining of the system around a different power optimization point.

In some embodiments, the target circuit undergoing in situ characterization or training executes a process that can tolerate some level of errors. For example, a graphics accelerator may render an image and tolerate some errors in some pixels. When the error rate exceeds a threshold level, however, a new training or in situ characterization may be conducted to identify a new optimization point to lower the error rate by, for example, setting a higher voltage level or a lower the clock frequency.

Asymmetric functions with low cost validation are another example of processes that can tolerate some level of errors. In the field of cryptography, for example, the Rivest-Shamir-Adleman (RSA) algorithm is a public-key encryption process in which a decryption result can be verified relatively easily compared to the encryption. In some embodiments, each costly RSA decrypt is followed by an inverse RSA encrypt operation to ensure correctness. In some embodiments, the RSA decrypt process is conducted on a target circuit, and the results are checked for correctness. The error check in some embodiments is conducted as a matter of course, and can be adapted to trigger a training of the target circuit. In other words, when a rate of errors in the results exceeds a threshold level, a new training or in situ characterization may be conducted to identify a new optimization point to lower the error rate by, for example, setting a higher voltage level or a lower the clock frequency.

In some embodiments, compression/decompression and similar functions that are routinely verified with the inverse function to ensure that there are no errors can also be adapted to trigger a training of the target circuit. Since the decompress function is performed as a matter of course on newly compressed data to ensure data is not lost, the compress function itself can tolerate errors because they will be detected when the data is decompressed and compared to the input data. When this occurs, the data can be re-compressed and re-verified, and at a certain threshold rate of errors, can trigger training or in-situ characterization to occur again.

Deep Learning scoring is another example of a function that may tolerate low precision arithmetic and errors edges with minimal loss of quality. In Deep Learning scoring, trained network parameters are programmed into a neural network and used to evaluate test data. In non-mission-critical applications such as recognizing objects in images a certain rate of error could be tolerated. A test image or images can be periodically included in a batch of images being scored to detect when errors are occurring. When a threshold is exceeded a new training or in situ characterization may be conducted to identify a new optimization point to lower the error rate by, for example, setting a higher voltage level or a lower the clock frequency FIG. 1 is a block diagram illustrating a system in which at least some guardband is recovered using in situ characterization, according to some embodiments. As shown, target ASIC/processor 102 is the target of the in situ characterization. Target ASIC/processor 102 in some embodiments is a general purpose processor. In some embodiments, target ASIC/processor 102 is a fixed-function processor. Target ASIC/processor 102 in some embodiments is a circuit, such as a graphics accelerator or fixed-function encryption circuit included within an ASIC or processor.

Target ASIC/processor 102 in some embodiments is a Field-Programmable Gate Array (FPGA), which can undergo the in situ characterization either before it is programmed or after it is programmed. When in situ characterization is performed on an un-programmed FPGA, the plurality of tests used during the characterization is to target the full set of functionality of the FPGA. When in situ characterization is performed on a programmed FPGA, the plurality of tests used during the characterization is to target specific FPGA functions. As used herein, target ASIC/processor 102 is sometimes referred to as "target circuit."

FIG. 1 also shows system components, including temperature sensor 104, a phase-locked loop, PLL 106, and voltage regulator 108, used in a system or method of guardband recovery using in situ characterization according to some embodiments.

Temperature Sensor: temperature sensor 104 is shown as being included in target circuit 102, but in other embodiments is external to target circuit 102. Temperature sensor 104 may utilize any of several methods to measure the temperature of target circuit 102. In some embodiments, temperature sensor 104 uses a thermocouple to produce a temperature-dependent voltage at a junction between two conductors as a result of the thermoelectric effect. In some embodiments, temperature sensor 104 uses a thermistor, or temperature-sensitive resistor. In some embodiments, temperature sensor 104 uses a silicon bandgap temperature sensor, for example by measuring a temperature-dependent junction current of a diode. In some embodiments, temperature sensor 104 measures the ambient temperature near target circuit 102 as an indication of the temperature of target circuit 102. Temperature sensor 104, in some embodiments, includes an analog to digital converter to convert an analog measured value into a digital value for use by control circuitry. There is a wide variety of embodiments of temperature sensor 104, and embodiments herein are not limited to any particular one.

Phase Locked Loop (PLL): PLL 106 provides a clock for use by target circuit 102. PLL 106 is shown as being included in target circuit 102, but in other embodiments is entirely external to target circuit 102, and in yet other embodiments is partially external to target circuit 102. PLL 106, according to some embodiments, multiplies a low-frequency clock (not shown), for example 50 MHz or 100 MHz reference clock, into one or more higher-frequency clocks for use by target circuit 102. In some embodiments, PLL 106 is programmable and allows the frequency of the clock supplied to target circuit 102 to be varied.

Voltage Regulator: Voltage regulator 108 provides a variable voltage to the target circuit. Voltage regulator 108 is shown as being external to target circuit 102, but in other embodiments is internal to target circuit 102, and in yet other embodiments is partially internal to target circuit 102. Voltage regulator 108 provides a relatively stable and constant voltage supply to target circuit 102.

Host Processor: FIG. 1 also shows host processor 110, which utilizes memory 112 to store data, storage 114 to store code and data, input/output (I/O) 116 to exchange data with target circuit 102, control 118 to control target circuit 102, and voltage control 124 to control voltage regulator 108. Host processor 110 is enclosed in a dotted line to indicate that it is optional. Some embodiments exclude host processor 110, and instead use the cloud-based manager 122 to perform guardband recovery using in situ characterization of target circuit 102. In some embodiments, whether performed by host processor 110 or by cloud-based manager 122, or both, a process of guardband recovery using in situ characterization of target circuit 102 is performed as described below with respect to FIG. 6, FIG. 7, or FIG. 8.

Cloud-Based Manager: FIG. 1 also shows cloud-based manager 122, which receives telemetry and provides control over the Ethernet connection 120. Cloud-based manager 122 is outlined in a dashed line, indicating that it, as well as Ethernet connection 120, are optional. When cloud-based manager 122 is not included, host processor 110 performs the process of guardband recovery using in situ characterization of target circuit 102. In some embodiments, functional tests and characterization code are stored on storage 114, and are used by host processor 110 to exercise target circuit 102.

When cloud-based manager is included, on the other hand, it can exercise target circuit 102 remotely through host processor 110. Cloud-based manager 122 can monitor telemetry data received from target circuit 102. In some embodiments, cloud-based manager 122 monitors and controls in situ characterization and guardband recovery of multiple target circuits 102. In some embodiments, cloud-based manager 122 monitors and controls in situ characterization and guardband recovery of multiple processors in a datacenter. In some embodiments, cloud-based manager 122 is a mobile computing device configured to be operated remotely by a system administrator to monitor and control in situ characterization and guardband recovery of processors in a datacenter. In some embodiments, cloud-based manager 122 is used to monitor and control in situ characterization and guardband recovery of processors across multiple facilities of a corporate network. In embodiments that do not include optional host processor 110, target circuit 102 includes a network interface and cloud-based manager 122 communicates directly with target circuit 102, for example over an Ethernet network.

Figure 2:
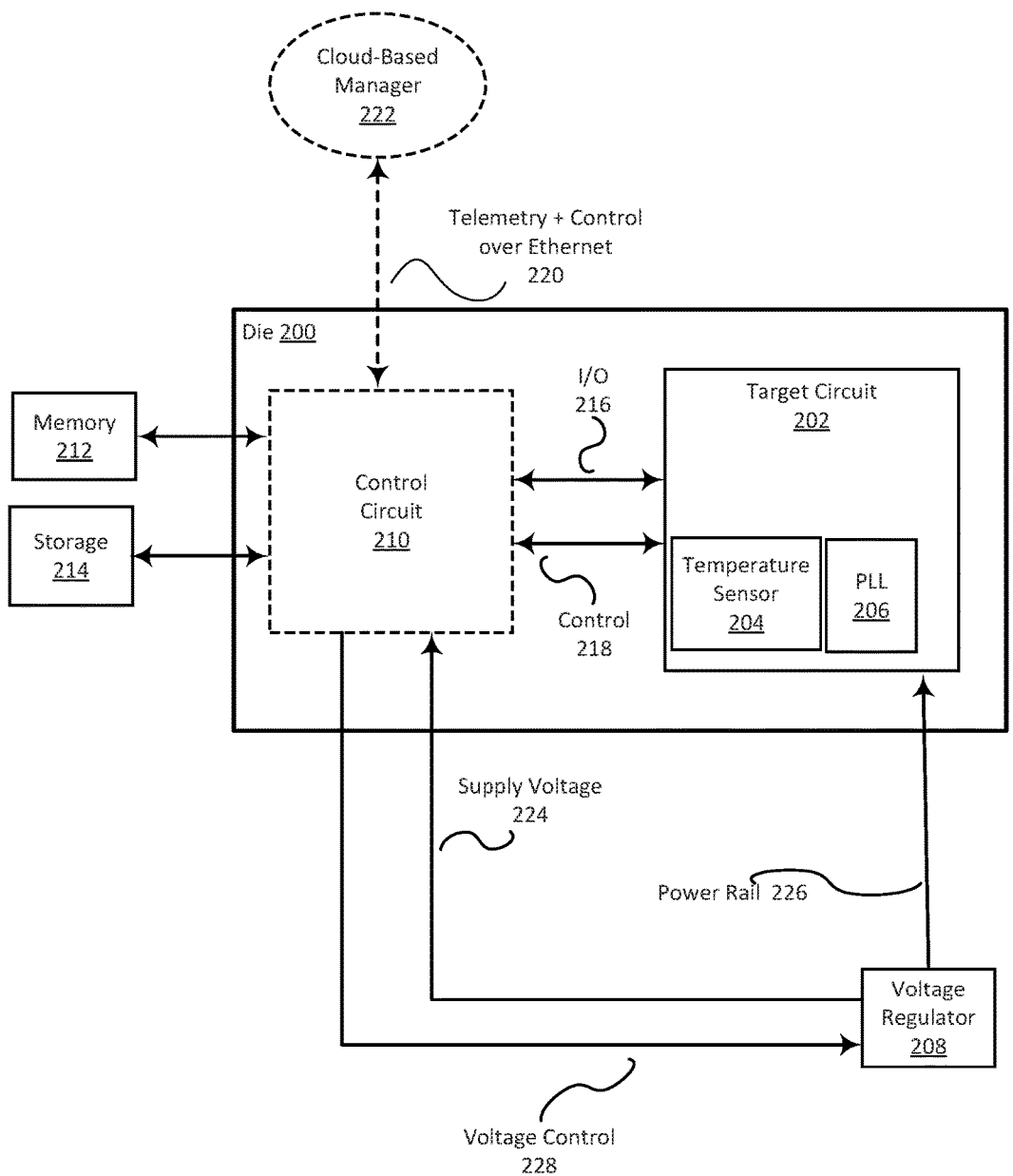
FIG. 2 is a block diagram illustrating a system in which at least some guardband is recovered using in situ characterization, according to some embodiments.

FIG. 2 is a block diagram illustrating a system in which at least some guardband is recovered using in situ characterization, according to some embodiments. As shown, target circuit 202 is the target of the in situ characterization. Target circuit 202, in some embodiments, is a general purpose processor. In some embodiments, target circuit 202 is a fixed-function processor. Target circuit 202 in some embodiments is a circuit, such as a graphics accelerator or fixed-function encryption circuit included within an ASIC or processor.

FIG. 2 also shows system components, including temperature sensor 204, phase-locked loop (PLL) 206, and voltage regulator 208, which in some embodiments are similar to temperature sensor 104, PLL 106, and voltage regulator 108, as described above with reference to FIG. 1. In the embodiment of FIG. 2, control circuit 210, target circuit 202, temperature sensor 204, and PLL 206 are disposed on the same die 200, while voltage regulator 208 is external to die 200.

FIG. 2 also shows control circuit 210, which utilizes memory 212 to store data, storage 214 to store code and data, input/output (I/O) 216 to exchange data with target circuit 202, control 218 to control target circuit 202, and voltage control 228 to control voltage regulator 208. Control circuit 210 is enclosed in a dotted line to indicate that it is optional. Some embodiments exclude control circuit 210, and instead use the cloud-based manager 222 to perform guardband recovery using in situ characterization of target circuit 202.

In some embodiments, whether performed by control circuit 210 or by cloud-based manager 222, or both, a process of guardband recovery using in situ characterization of target circuit 202 is performed as described below with respect to FIG. 6, FIG. 7, or FIG. 8. The embodiment shown in FIG. 2 provides a power rail 226 to target circuit 202, and a supply voltage 224 to control circuit 210. In some embodiments, power rail 226 is isolated from supply voltage 224 such that target circuit 202 can be power cycled without interfering with the supply voltage used by control circuit 210.

FIG. 2 also shows cloud-based manager 222, which receives telemetry and provides control over the Ethernet connection 220. Cloud-based manager 222 is outlined in a dashed line, indicating that it, as well as Ethernet connection 220, are optional. When cloud-based manager 222 is not included, control circuit 210 performs the process of guardband recovery using in situ characterization of target circuit 202. In some embodiments, functional tests and characterization code are stored on storage 214, and are used by control circuit 210 to exercise target circuit 202.

When cloud-based manager 222 is included, on the other hand, it is connected to control circuit 210 via a network, and can exercise target circuit 202 remotely through control circuit 210. Cloud-based manager 222 can monitor telemetry data received from target circuit 202. In some embodiments, cloud-based manager 222 monitors and controls in situ characterization and guardband recovery of multiple target circuits 202. In some embodiments, cloud-based manager 222 monitors and controls in situ characterization and guardband recovery of multiple processors in a datacenter. In some embodiments, cloud-based manager 222 is a mobile computing device configured to be operated remotely by a system administrator to monitor and control in situ characterization and guardband recovery of processors in a datacenter. In some embodiments, cloud-based manager 222 is used to monitor and control in situ characterization and guardband recovery of processors across multiple facilities of a corporate network. In embodiments that do not include optional control circuit 210, target circuit 202 includes a network interface and cloud-based manager 222 communicates directly with target circuit 202, for example over an Ethernet network.

Figure 3:
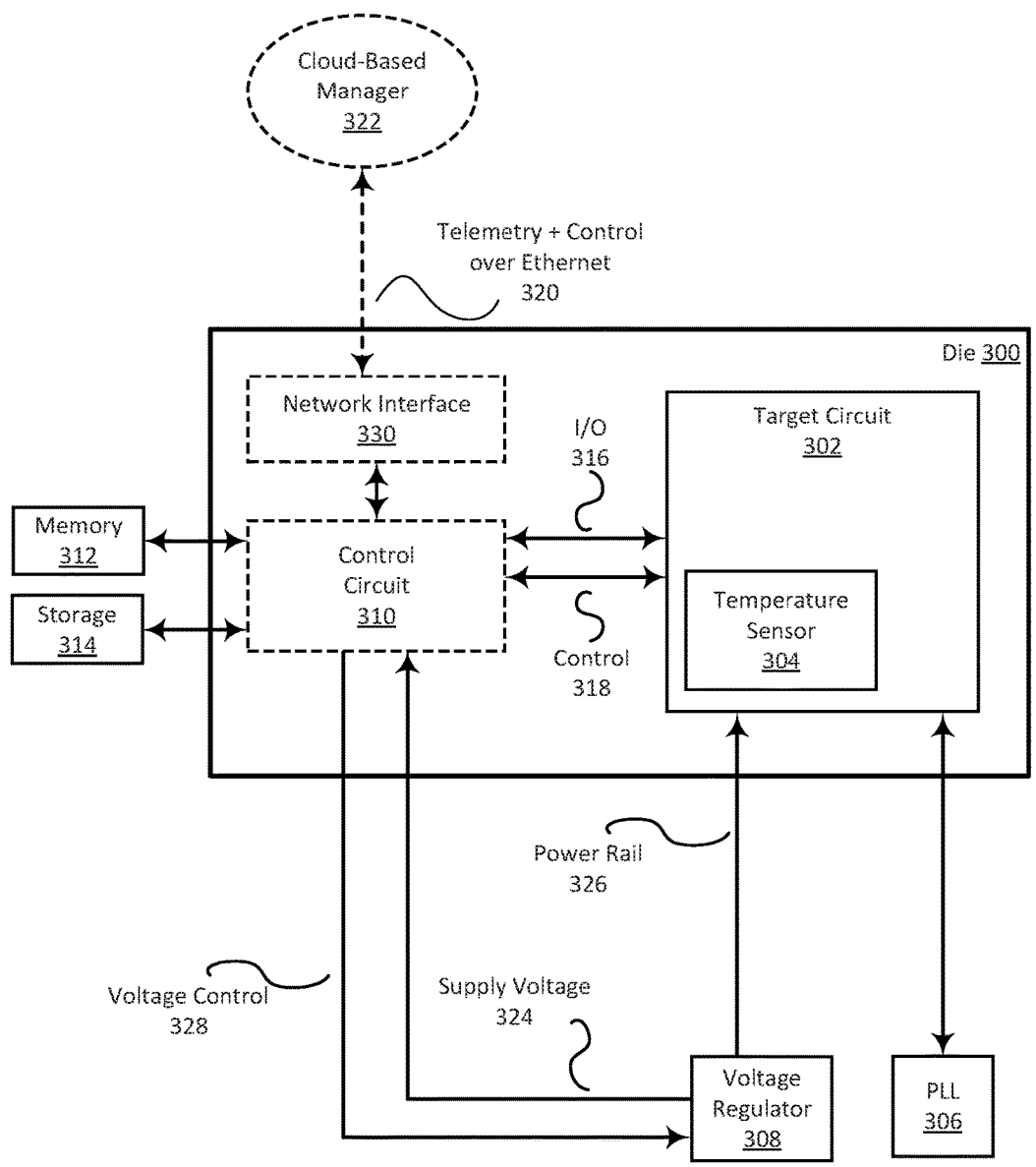
FIG. 3 is a block diagram illustrating a system in which at least some guardband is recovered using in situ characterization, according to some embodiments.

FIG. 3 is a block diagram illustrating a system in which at least some guardband is recovered using in situ characterization, according to some embodiments. As shown, target circuit 302 is the target of the in situ characterization. Target circuit 302 in some embodiments is a general purpose processor. In some embodiments, target circuit 302 is a fixed-function processor. Target circuit 302 in some embodiments is a circuit, such as a graphics accelerator or fixed-function encryption circuit included within an ASIC or processor.

FIG. 3 also shows system components, including temperature sensor 304, phase-locked loop (PLL) 306, and voltage regulator 308, which in some embodiments are similar to temperature sensor 104, PLL 106, and voltage regulator 108, as described above with reference to FIG. 1. In the embodiment of FIG. 3, control circuit 310, target circuit 302, and temperature sensor 304 are disposed on the same die 300, while PLL 306 and voltage regulator 308 are external to die 300.

FIG. 3 also shows control circuit 310, which utilizes memory 312 to store data, storage 314 to store code and data, input/output (I/O) 316 to exchange data with target circuit 302, control 318 to control target circuit 302, and voltage control 328 to control voltage regulator 308. Control circuit 310 is enclosed in a dotted line to indicate that it is optional. Some embodiments exclude control circuit 310, and instead use the cloud-based manager 322 to perform guardband recovery using in situ characterization of target circuit 302.

In some embodiments, whether performed by control circuit 310 or by cloud-based manager 322, or both, a process of guardband recovery using in situ characterization of target circuit 302 is performed as described below with respect to FIG. 6, FIG. 7, or FIG. 8, the embodiment shown in FIG. 3 provides a power rail 326 to target circuit 302, and a supply voltage 424 to control circuit 310. In some embodiments, power rail 326 is isolated from supply voltage 324 such that a failure or need to reset target circuit 302 does not interfere with the supply voltage used by control circuit 310.

In some embodiments, functional tests and characterization code are stored on storage 314, and are used by control circuit 310 to exercise target circuit 302.

FIG. 3 also shows optional cloud-based manager 322, which receives telemetry and provides control over the Ethernet connection 320. Cloud-based manager 322 and network interface 330 are outlined in dashed lines, indicating that they are optional. When cloud-based manager 322 is not included, control circuit 310 performs the process of guardband recovery using in situ characterization of target circuit 302.

When network interface 330 and cloud-based manager 322 are included, control circuit 310 can receive and respond to commands. In such embodiments, cloud-based manager 322 issues commands to control circuit 310. Cloud-based manager 322 can issue commands to exercise target circuit 302 remotely through control circuit 310. In such embodiments, cloud-based manager 322 can monitor telemetry data received from target circuit 302.

In embodiments that do not include optional control circuit 310, target circuit 302 includes a network interface and cloud-based manager 322 communicates directly with target circuit 302, for example over an Ethernet network.

In some embodiments, cloud-based manager 322 monitors and controls in situ characterization and guardband recovery of multiple target circuits 302, for example multiple computers at a data center. In some embodiments, cloud-based manager 322 is a mobile computing device configured to be operated remotely by a system administrator to monitor and control in situ characterization and guardband recovery of processors in a datacenter. In some embodiments, cloud-based manager 322 is used to monitor and control in situ characterization and guardband recovery of processors across multiple facilities of a corporate network.

Figure 4:
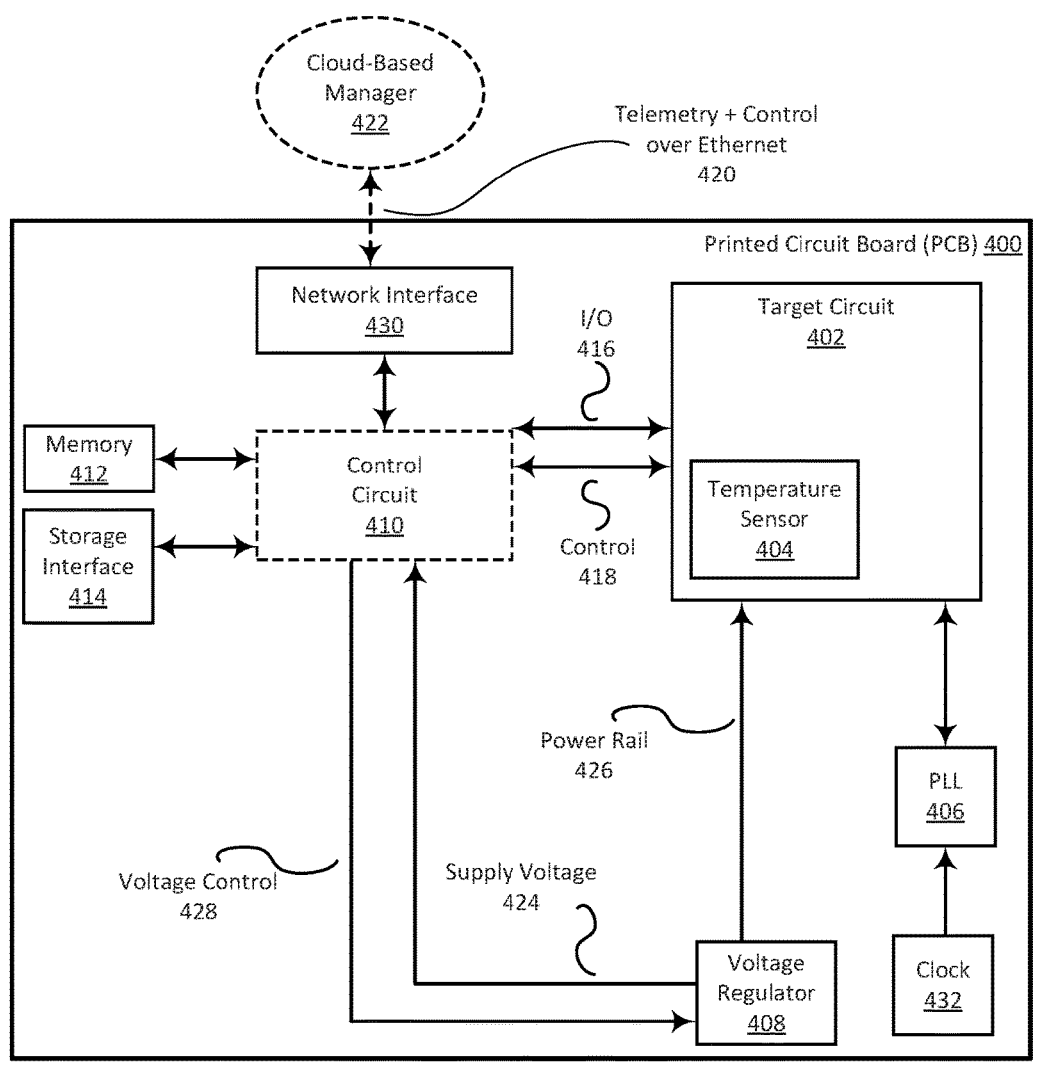
FIG. 4 is a block diagram illustrating a system in which at least some guardband is recovered using in situ characterization, according to some embodiments.

FIG. 4 is a block diagram illustrating a system in which at least some guardband is recovered using in situ characterization, according to some embodiments. FIG. 4 shows printed circuit board (PCB) 400, on which are disposed target circuit 402, control circuit 410, and network interface 430. As shown, target circuit 402 is the target of the in situ characterization. Target circuit 402 in some embodiments is a general purpose processor. In some embodiments, target circuit 402 is a fixed-function processor. Target circuit 402 in some embodiments is a circuit, such as a graphics accelerator or fixed-function encryption circuit included within an ASIC or processor.

FIG. 4 also shows system components, including temperature sensor 404, phase-locked loop (PLL) 406, and voltage regulator 408, which in some embodiments are similar to temperature sensor 104, PLL 106, and voltage regulator 108, as described above with reference to FIG. 1. In the embodiment of FIG. 4, control circuit 410, target circuit 402, temperature sensor 404, PLL 406, and voltage regulator 408 are disposed on the same PCB 400.

FIG. 4 also shows clock 432, which in this embodiment serves as a reference clock to PLL 106. Though not shown, the basic parts inside clock 432 in some embodiments are a resonant circuit and an amplifier. In some embodiments, the resonant circuit is a quartz piezo-electric oscillator. In alternate embodiments, the resonant circuit is a tank circuit. In alternate embodiments, the resonant circuit is a resistor-capacitor (RC) circuit. In some embodiments, the amplifier circuit inverts the signal from the oscillator and feeds a portion back into the oscillator to maintain oscillation.

FIG. 4 also shows control circuit 410, which utilizes memory 412 to store data, storage 414 to store code and data, supply voltage 424 to receive a supply voltage from voltage regulator 408, input/output (I/O) 416 to exchange data with target circuit 402, control 418 to control target circuit 402, and voltage control 428 to control voltage regulator 408. Control circuit 410 is enclosed in a dotted line to indicate that it is optional. Some embodiments exclude control circuit 410, and instead use the cloud-based manager 422 to perform guardband recovery using in situ characterization of target circuit 402.

In some embodiments, whether performed by control circuit 410 or by cloud-based manager 422, or both, a process of guardband recovery using in situ characterization of target circuit 402 is performed as described below with respect to FIG. 6, FIG. 7, or FIG. 8. The embodiment shown in FIG. 4 provides a power rail 426 to target circuit 402, and a supply voltage 424 to control circuit 410. In some embodiments, power rail 426 is isolated from supply voltage 424 such that a failure or need to reset target circuit 402 does not interfere with the supply voltage used by control circuit 410.

FIG. 4 also shows cloud-based manager 422, which receives telemetry data and provides control over the Ethernet connection 420. Cloud-based manager 422 is outlined in a dashed line, indicating that it, as well as Ethernet connection 420, are optional. When cloud-based manager 422 is not included, control circuit 410 performs the process of guardband recovery using in situ characterization of target circuit 402. In some embodiments, functional tests and characterization code are stored on storage 414, and are used by control circuit 410 to exercise target circuit 402.

When cloud-based manager is included, on the other hand, it is connected to control circuit 410 via a network, using network interface 430. In such embodiments, cloud-based manager 422 can exercise target circuit 402 remotely through control circuit 410. Cloud-based manager 422 can monitor telemetry data received from target circuit 402. In some embodiments, cloud-based manager 422 monitors and controls in situ characterization and guardband recovery of multiple target circuits 402. In some embodiments, cloud-based manager 422 monitors and controls in situ characterization and guardband recovery of multiple processors in a datacenter. In some embodiments, cloud-based manager 422 is a mobile computing device configured to be operated remotely by a system administrator to monitor and control in situ characterization and guardband recovery of processors in a datacenter. In some embodiments, cloud-based manager 422 is used to monitor and control in situ characterization and guardband recovery of processors across multiple facilities of a corporate network. In embodiments that do not include optional control circuit 410, target circuit 402 includes a network interface and cloud-based manager 422 communicates directly with target circuit 402, for example over an Ethernet network.

Figure 5A:
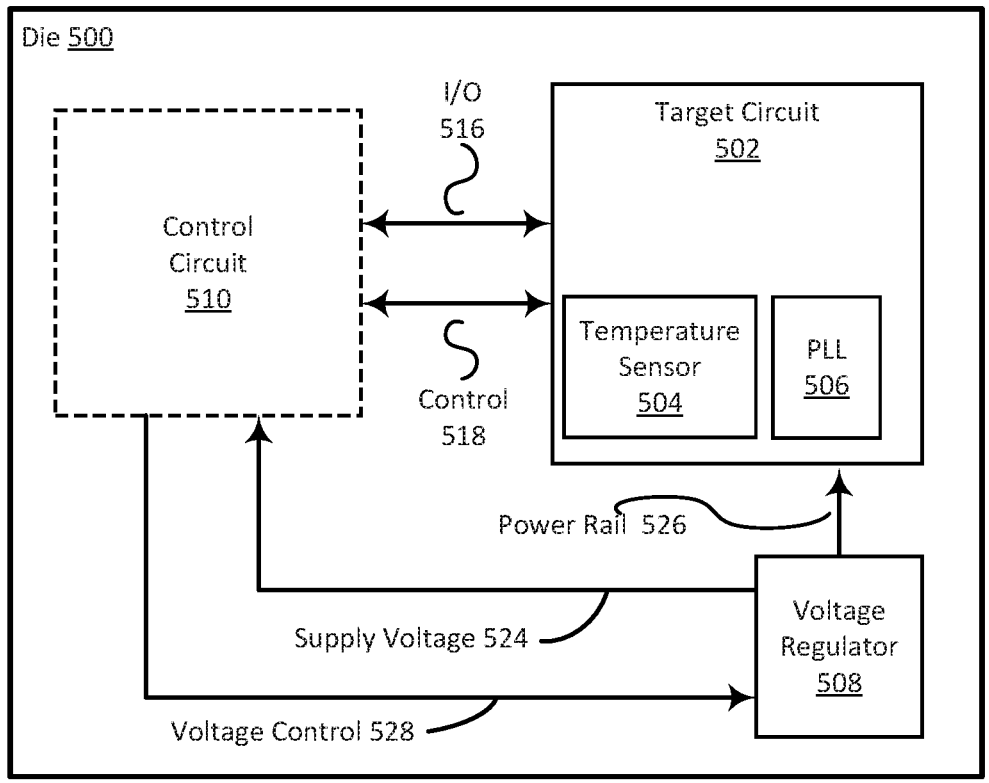
FIG. 5A is a block diagram of a die on which at least some guardband is recovered using in situ characterization, according to some embodiments.

FIG. 5A is a block diagram and cross-sectional view of a die on which at least some guardband is recovered using in situ characterization, according to some embodiments. FIG. 5A shows die 500, on which are disposed target circuit 502, control circuit 510, temperature sensor 504, phase-locked loop (PLL) 506, and voltage regulator 508. As shown, target circuit 502 is the target of the in situ characterization. Target circuit 502 in some embodiments is a general purpose processor. In some embodiments, target circuit 502 is a fixed-function processor. Target circuit 502 in some embodiments is a circuit, such as a graphics accelerator or fixed-function encryption circuit included within an ASIC or processor.

FIG. 5A also shows system components, including temperature sensor 504, phase-locked loop (PLL) 506, and voltage regulator 508, which in some embodiments are similar to temperature sensor 104, PLL 106, and voltage regulator 108, as described above with reference to FIG. 1. In the embodiment of FIG. 5A, control circuit 510, target circuit 502, temperature sensor 504, PLL 506, and voltage regulator 508 are disposed on the same die 500.

FIG. 5A also shows control circuit 510, which utilizes supply voltage 524 to receive a supply voltage from voltage regulator 508, input/output (I/O) 516 to exchange data with target circuit 502, control 518 to control target circuit 502, and voltage control 528 to control voltage regulator 508. Control circuit 510 is enclosed in a dotted line to indicate that it is optional. Some embodiments exclude control circuit 510, and instead use the cloud-based manager 522 to perform guardband recovery using in situ characterization of target circuit 502.

In some embodiments, whether performed by control circuit 510 or by cloud-based manager 522, or both, a process of guardband recovery using in situ characterization of target circuit 502 is performed as described below with respect to FIG. 6, FIG. 7, or FIG. 8.

Figure 5B:
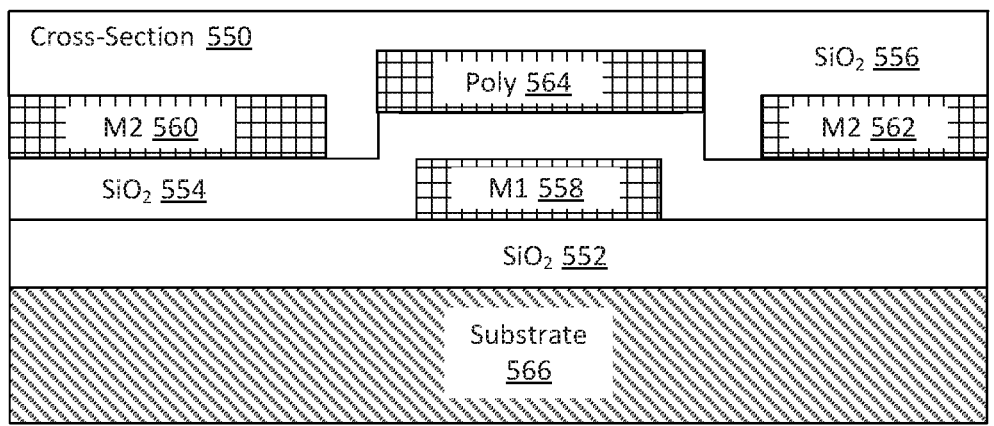
FIG. 5B is a cross-sectional view of a die in accordance with the embodiment shown in FIG. 5A.

The embodiment shown in FIG. 5A provides a power rail 526 to target circuit 502, and a supply voltage 524 to control circuit 510. In some embodiments, power rail 526 is isolated from supply voltage 524 such that a failure or need to reset target circuit 502 does not interfere with the supply voltage used by control circuit 510. FIG. 5B shows a cross-sectional view 550 of die 500, in which some of the layers of the multi-layer structure are shown, including silicon dioxide ($SiO_2$) 552, 554, and 556, metal one (M1) 558, metal two (M2) 560, 562, polysilicon (poly) 564, and substrate 566. In some embodiments, power rail 526 is separate from supply voltage 524 by using different metal layers. For example, power rail 526 may use M1 558 while supply voltage 524 uses M2 560 and 562. That way, power rail 526 is separated from supply voltage 524, at least by the width of an oxide layer 554.

Figure 6:
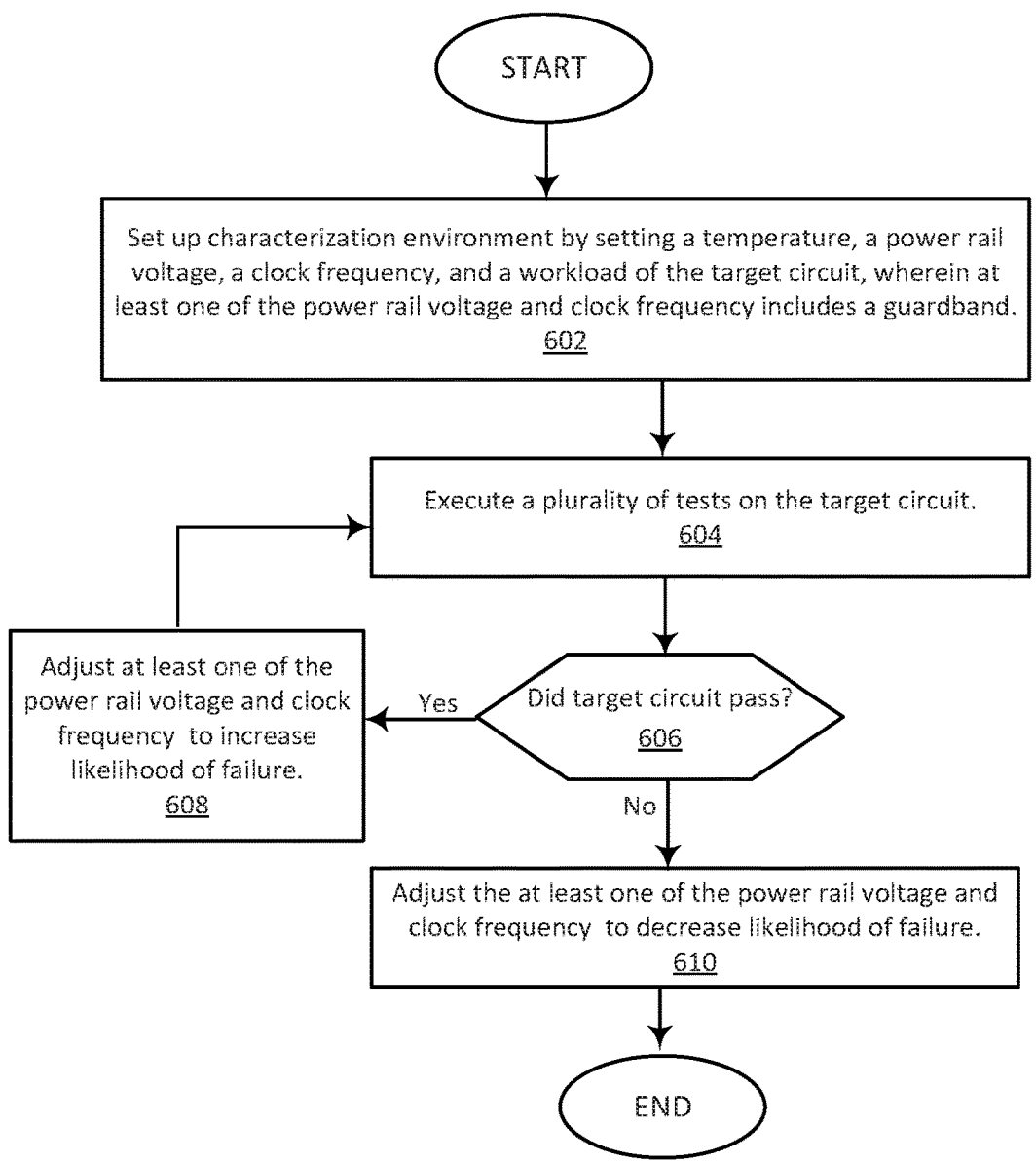
FIG. 6 is a flow diagram of a process performed by a control circuit to recover at least some guardband using in situ characterization and adjusting an independent variable, according to some embodiments.

FIG. 6 is a flow diagram of a process performed by a control circuit to recover at least one of a power rail voltage guardband and a clock frequency guardband using in situ characterization, according to some embodiments. In some embodiments, the process of FIG. 6 is executed by a host processor, for example host processor 110 (FIG. 1). In some embodiments, the process of FIG. 6 is executed by a control circuit, for example control circuit 210 (FIG. 2). In some embodiments, the process of FIG. 6 is executed by a cloud-based manager, for example, cloud-based manager 322 (FIG. 3). In some embodiments, the process of FIG. 6 is executed by a control circuit, such as control circuit 210 (FIG. 2), working in conjunction with cloud-based manager, for example cloud-based manager 322 (FIG. 3).

In some embodiments, the process of FIG. 6 is executed during a boot sequence after a power-on of the system. In other embodiments, the process of FIG. 6 is executed periodically, upon a passage of a predetermined amount of time, for example once every day, or once every hour, or once every five minutes, to name a few. In other embodiments, the process of FIG. 6 is executed upon an environmental condition, such as temperature, changing by greater than a threshold amount.

In other embodiments, the process of FIG. 6 is executed by a command, for example a command to perform an in situ characterization received by a host processor from a system administrator. In other embodiments, the process of FIG. 6 is executed by a command received from a cloud-based manager, for example a command received from a cloud-based manager to perform in situ characterization by a network of host processors in a corporate datacenter.

In some embodiments, the in situ characterization and guardband recovery illustrated in FIG. 6 is triggered in situ and in the course of normal operations of the target circuit. In some embodiments, the target circuit is a processor executing an algorithm that tolerates some error, and when the error rate exceeds a threshold level, an in situ characterization is triggered.

After starting, at 602 a characterization environment is set up by setting a temperature, a power rail voltage, a clock frequency, and a workload of the target circuit, wherein at least one of the power rail voltage and clock frequency includes a guardband. In some embodiments, the control circuit schedules work to be performed by the target circuit in order to exercise transistors and raise the temperature of the target circuit. In some embodiments, the power rail voltage of the target circuit is controlled, for example, by controlling voltage regulator 108, 208, 308, 408, and 508 (FIGS. 1-5). In some embodiments, the clock frequency of the target circuit is controlled by controlling a phase locked loop (PLL), for example, 106, 206, 306, 406, and 506 (FIGS. 1-5).

In some embodiments, the characterization environment values are selected based on tests conducted during manufacture, for example, an operating environment under which the target circuit passed a plurality of tests. In some embodiments, the characterization environment values are set according to some knowledge of the expected operating conditions, for example, a target circuit that is expected to operate in the Antarctic will start with a relatively low operating temperature.

At 604, a plurality of tests is executed on the target circuit. In some embodiments, the plurality of tests is designed to exercise as many transistors as possible in the target circuit, so as to maximize the chances of identifying a failing transistor during the test. In some embodiments, the plurality of tests is simulated in advance on a software model of the target circuit, and the coverage—the number of transistors that switch during the simulation—is maximized, so as to maximize the chances of identifying a failing transistor during the test. In some embodiments, the critical timing paths of the target circuit are identified in advance, and those critical timing paths are exercised by the plurality of tests. In some embodiments, in target circuits that support a Joint Test Access Group (JTAG) standard, a test access port (TAP) is used to serially scan in a worst-case state into registers of the target circuit, then the target circuit is allowed to execute the worst-case path to determine if the worst-case path passes. In some embodiments, the plurality of tests is generated by an automatic test-pattern generator.

At 606, it is determined whether the plurality of tests passed. In embodiments where the plurality of tests was simulated in advance on a software model of the target circuit, the simulated outputs of the target circuit are compared to the actual outputs of the target circuit to determine if the target circuit passed the plurality of tests. In embodiments where the plurality of tests were designed to exercise critical timing paths of the target circuit, the simulated outputs of the target circuit are compared to the actual outputs of the target circuit to determine whether the target circuit passed the plurality of tests. In target circuits that support the JTAG standard and in which a worst case state was serially scanned into registers of the target circuit, the state of the target circuit registers can be serially scanned out after an execution cycle from the TAP port, and can be analyzed to determine whether the target circuit passed the tests. In some embodiments, the plurality of tests is executed in advance or in parallel on a known-working version of the target circuit, and the outputs of the known-working target circuit are compared to the outputs of the target circuit to determine whether the target circuit passed the plurality of tests.

If the target circuit passes the plurality of tests, at 608 at least one of the power rail voltage and clock frequency is adjusted to increase the likelihood of failure. In one embodiment, the PLL is controlled to increase the clock frequency of the target circuit, thereby increasing the likelihood that the target circuit will fail the plurality of tests. In another embodiment, a voltage regulator is controlled to decrease voltage on a power rail supplying the target circuit, thereby increasing the likelihood that the target circuit will fail the plurality of tests. In another embodiment, the PLL and voltage regulator are both controlled to jointly optimize clock frequency and voltage.

After adjusting the at least one of the power rail voltage and clock frequency to increase the likelihood that the target circuit will fail, the process returns to 604 to rerun the plurality of tests. As long as it is determined at 606 that the plurality of tests passes, the process continues adjusting at least one of the power rail voltage and clock frequency at 608 to increase the likelihood of failure at 606 and rerunning the plurality of tests at 604.

Eventually, when it is determined at 606 that the plurality of tests did not pass, the at least one of the power rail voltage and clock frequency that was adjusted at 608 to increase the likelihood of failure is now adjusted at 610 to decrease the likelihood of failure. At this point, the target circuit is likely to pass the plurality of tests, and at least some guardband has been recovered. After 610, the process ends.

Figure 7:
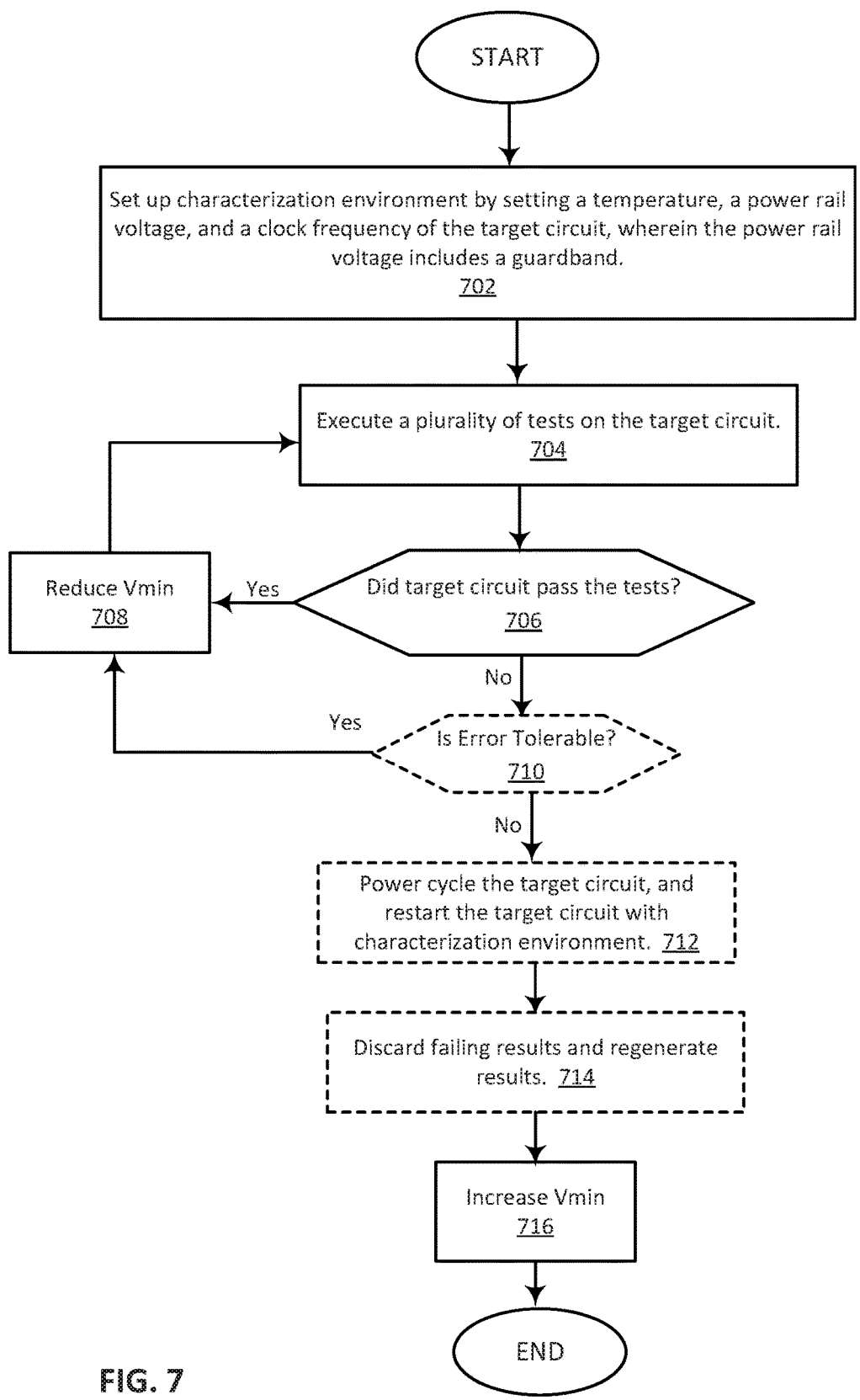
FIG. 7 is a flow diagram of a process performed by a control circuit to recover at least some guardband using in situ characterization and adjusting a voltage, according to some embodiments.

FIG. 7 is a flow diagram of a process performed by a control circuit to recover at least some Vmin guardband using in situ characterization, according to some embodiments. As used herein, the lowest power rail voltage supply at which the target circuit operates is sometimes referred to as Vmin, which is short for "minimum voltage."

In some embodiments, the process of FIG. 7 is executed by a host processor, for example host processor 110 (FIG. 1). In some embodiments, the process of FIG. 7 is executed by a control circuit, for example control circuit 210 (FIG. 2). In some embodiments, the process of FIG. 7 is executed by a cloud-based manager, for example cloud-based manager 322 (FIG. 3). In some embodiments, the process of FIG. 7 is executed by a control circuit, such as control circuit 210 (FIG. 2) in conjunction with a cloud-based manager—for example cloud-based manager 322 (FIG. 3).

In some embodiments, the process of FIG. 7 is executed during a boot sequence after a power-on of the system. In other embodiments, the process of FIG. 7 is executed periodically, upon passage of a predetermined amount of time, for example once every hour. In other embodiments, the process of FIG. 7 is executed upon a change in an environmental condition, such as temperature, changing by greater than a threshold amount. In other embodiments, the process of FIG. 7 is executed by a command, for example a command to perform an in situ characterization received by a host processor from a system administrator. In other embodiments, the process of FIG. 7 is executed in response to a command received from a cloud-based manager, for example a command received from cloud-based manager 322 (FIG. 3) to perform in situ characterization.

After starting, at 702 a characterization environment is set up by setting a temperature, a power rail voltage, a clock frequency, and a workload of the target circuit, wherein at least one of the power rail voltage and clock frequency includes a guardband. In some embodiments, the characterization environment values are selected based on tests conducted during manufacture, for example, an operating environment under which the target circuit passed a plurality of tests. In some embodiments, the characterization environment values are set according to some knowledge of the expected operating conditions, for example, a target circuit that is expected to operate in the Antarctic will start with a relatively low operating temperature.

At 704, a plurality of tests is executed on the target circuit. The plurality of tests to be run at 704 are similar to the plurality of tests illustrated and disclosed above with reference to FIG. 6 at 604.

At 706, it is determined whether the plurality of tests passed. Determining whether the target circuit passed the plurality of tests is disclosed and illustrated above with reference to FIG. 6 at 606.

If the target circuit passes the plurality of tests, at 708, the voltage regulator is controlled to decrease voltage on a power rail provided to the target circuit, thereby increasing the likelihood that the target circuit will fail the plurality of tests.

After reducing the power rail voltage provided to the target circuit to increase the likelihood that the target circuit will fail, the process returns to 704 and reruns the plurality of tests. As long as it is determined at 706 that the plurality of tests passed, the process continues reducing the power rail voltage at 708 to increase the likelihood of failure, and to rerun the plurality of tests at 704.

Tolerable Error: Eventually, when it is determined at 706 that the plurality of tests did not pass, at 710 it is optionally determined whether the error is tolerable. In some embodiments, the process is to tolerate some amount of error at 706. For example, when testing a graphics processing unit, it may be tolerable for 1 or a few pixels of an output frame to have an incorrect red/green/blue (RGB) value.

In some embodiments, when the number of errors is below a tolerance threshold, the target circuit is considered at 706 to pass the plurality of tests. In some embodiments, the control circuit maintains a count of errors, and tolerates the errors when they number fewer than an error count threshold. In some embodiments, a tolerance threshold is programmatically assigned. For example, a host processor executing the process of FIG. 6 may include a model-specific register (MSR) or other memory-mapped register that is programmed with a tolerance value, for example an integer value between 0 and 7. When better performance is desired at the cost of some more errors, the tolerance value is set to a high value.

When it is deemed at 710 that the error is tolerable, the process returns to 708 to reduce Vmin and then execute the plurality of tests again at 704.

When it is deemed at 710 that the error is not tolerable, the target circuit is optionally power cycled at 712. Some embodiments do not perform the power cycle of 712, so 712 is shown with a dashed border. In some embodiments, the power cycling at 712 is used to reset the target circuit that has entered a metastable state. In some embodiments, the target circuit is on a different power plane than the host processor or the control circuit executing the process of FIG. 7, and can therefore be power cycled while allowing the control circuit to continue normal operation.

At 714, the test results that were deemed to fail the plurality of tests at 706 are optionally discarded. The discarding results of 714 and the power cycling of 712 in some embodiments both take place. In other embodiments, one of 712 and 714 takes place.

At 716, the power rail voltage that was reduced at 708 to increase the likelihood of failure is now increased at 710 to decrease the likelihood of failure. At this point, the target circuit is likely to pass the plurality of tests, and at least some Vmin guardband has been recovered. After 716, the process ends.

Figure 8:
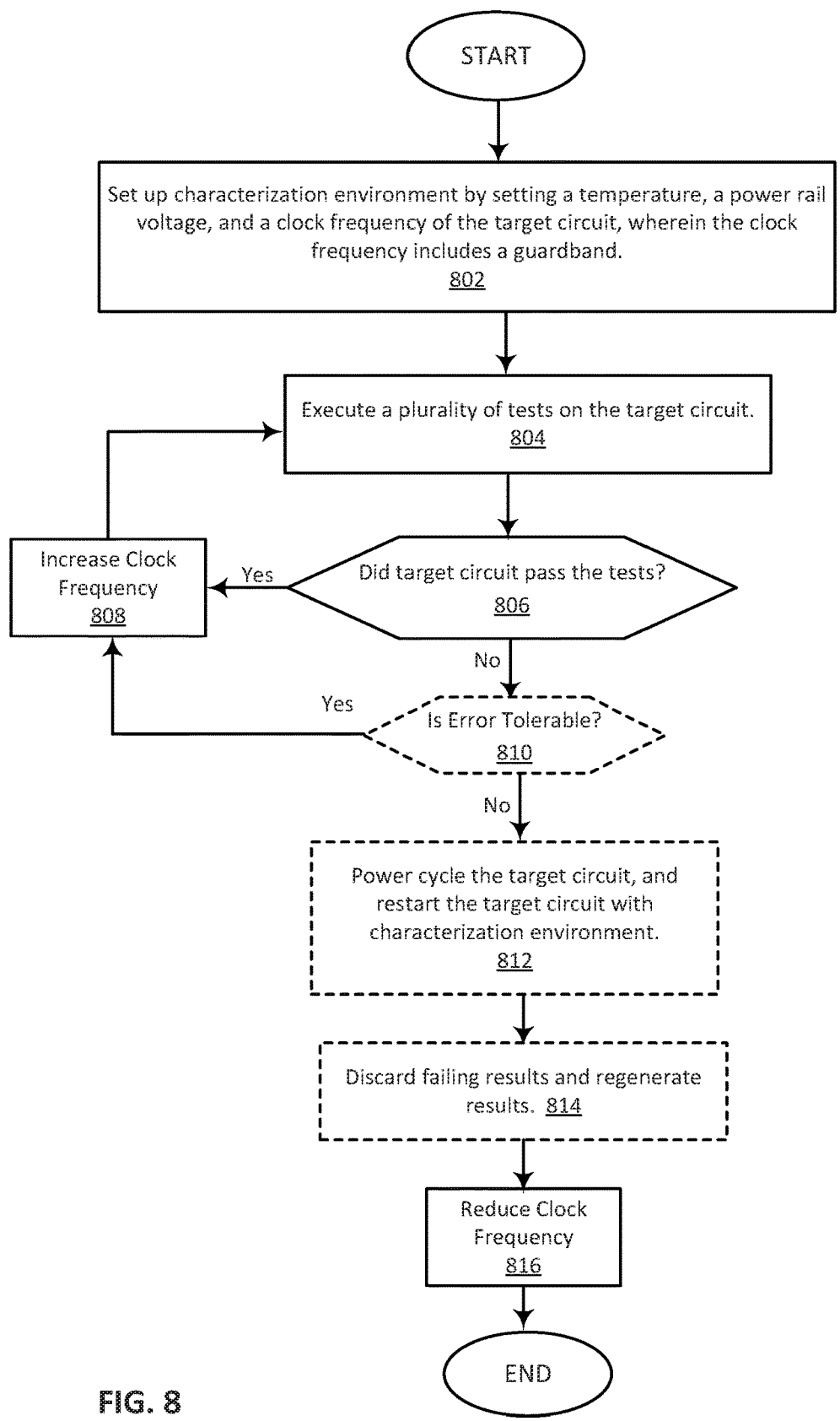
FIG. 8 is a flow diagram of a process performed by a control circuit to recover at least some guardband using in situ characterization and adjusting a temperature, according to some embodiments.

FIG. 8 is a flow diagram of a process performed by a control circuit to recover at least some clock frequency guardband using in situ characterization, according to some embodiments.

In some embodiments, the process of FIG. 8 is executed by a host processor, for example host processor 110 (FIG. 1). In some embodiments, the process of FIG. 8 is executed by a control circuit, for example control circuit 210 (FIG. 2). In some embodiments, the process of FIG. 8 is executed by a cloud-based manager, for example cloud-based manager 322 (FIG. 3). In some embodiments, the process of FIG. 8 is executed by a control circuit, such as control circuit 210 (FIG. 2) in conjunction with a cloud-based manager—for example cloud-based manager 322 (FIG. 3).

In some embodiments, the process of FIG. 8 is executed during a boot sequence after a power-on of the system. In other embodiments, the process of FIG. 8 is executed periodically, upon passage of a predetermined amount of time, for example once every hour. In other embodiments, the process of FIG. 8 is executed upon a change in an environmental condition, such as temperature, changing by greater than a threshold amount. In other embodiments, the process of FIG. 8 is executed by a command, for example a command to perform an in situ characterization received by a host processor from a system administrator. In other embodiments, the process of FIG. 8 is executed in response to a command received from a cloud-based manager, for example a command received from cloud-based manager 322 (FIG. 3) to perform in situ characterization.

After starting, at 802 a characterization environment is set up by setting a temperature, a power rail voltage, a clock frequency, and a workload of the target circuit, wherein at least one of the power rail voltage and clock frequency includes a guardband. In some embodiments, the characterization environment values are selected based on tests conducted during manufacture, for example, an operating environment under which the target circuit passed a plurality of tests. In some embodiments, the characterization environment values are set according to some knowledge of the expected operating conditions, for example, a target circuit that is expected to operate in the Antarctic will start with a relatively low operating temperature.

At 804, a plurality of tests is executed on the target circuit. The plurality of tests to be run at 804 are similar to the plurality of tests illustrated and disclosed above with reference to FIG. 6 at 604.

At 806, it is determined whether the plurality of tests passed. Determining whether the target circuit passed the plurality of tests is disclosed and illustrated above with reference to FIG. 6 at 606.

If the target circuit passes the plurality of tests, at 808, the voltage regulator is controlled to decrease voltage on a power rail provided to the target circuit, thereby increasing the likelihood that the target circuit will fail the plurality of tests.

After reducing the power rail voltage provided to the target circuit to increase the likelihood that the target circuit will fail, the process returns to 804 and reruns the plurality of tests. As long as it is determined at 806 that the plurality of tests passed, the process continues reducing the power rail voltage at 808 to increase the likelihood of failure, and to rerun the plurality of tests at 804.

Tolerable Error: Eventually, when it is determined at 806 that the plurality of tests did not pass, at 810 it is optionally determined whether the error is tolerable. In some embodiments, the process is to tolerate some amount of error at 806. For example, when testing a graphics processing unit, it may be tolerable for 1 or a few pixels of an output frame to have an incorrect red/green/blue (RGB) value.

In some embodiments, when the number of errors is below a tolerance threshold, the target circuit is considered at 806 to pass the plurality of tests. In some embodiments, the control circuit maintains a count of errors, and tolerates the errors when they number fewer than an error count threshold. In some embodiments, a tolerance threshold is programmatically assigned. For example, a host processor executing the process of FIG. 6 may include a model-specific register (MSR) or other memory-mapped register that is programmed with a tolerance value, for example an integer value between 0 and 7. When better performance is desired at the cost of some more errors, the tolerance value is set to a high value.

When it is deemed at 810 that the error is tolerable, the process returns to 808 to reduce clock frequency and then execute the plurality of tests again at 804.

When it is deemed at 810 that the error is not tolerable, the target circuit is optionally power cycled at 812. Some embodiments do not perform the power cycle of 812, so 812 is shown with a dashed border. In some embodiments, the power cycling at 812 is used to reset the target circuit that has entered a metastable state. In some embodiments, the target circuit is on a different power plane than the host processor or the control circuit executing the process of FIG. 8, and can therefore be power cycled while allowing the control circuit to continue normal operation.

At 814, the test results that were deemed to fail the plurality of tests at 806 are optionally discarded. The discarding results of 814 and the power cycling of 812 in some embodiments both take place. In other embodiments, one of 812 and 814 takes place.

At 816, the power rail voltage that was reduced at 808 to increase the likelihood of failure is now increased at 810 to decrease the likelihood of failure. At this point, the target circuit is likely to pass the plurality of tests, and at least some clock frequency guardband has been recovered. After 816, the process ends.

Exemplary Host Processor

Figure 9:
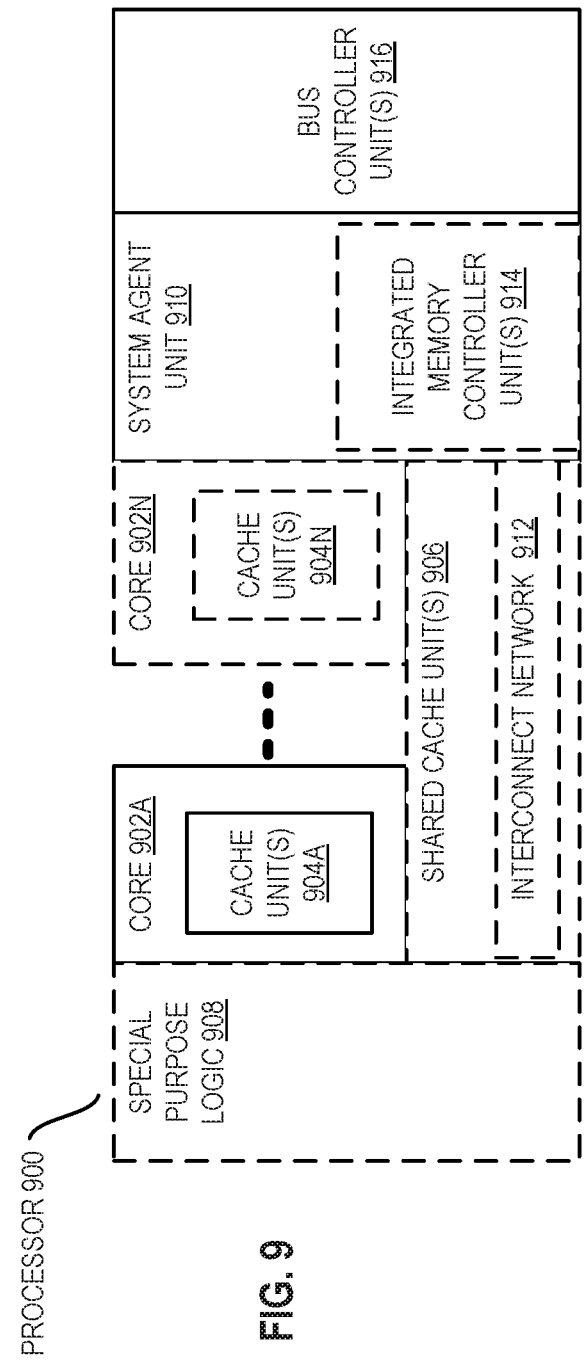
FIG. 9 is a block diagram of a processor that may have more than one core, may have an integrated memory controller, and may have integrated graphics, according to some embodiments.

FIG. 9 is a block diagram of a processor that may have more than one core, may have an integrated memory controller, and may have integrated graphics according to embodiments of the invention. The solid lined boxes in FIG. 9 illustrate a processor 900 with a single core 902A, a system agent 910, a set of one or more bus controller units 916, while the optional addition of the dashed lined boxes illustrates an alternative processor 900 with multiple cores 902A-N, a set of one or more integrated memory controller unit(s) 914 in the system agent unit 910, and special purpose logic 908.

Thus, different implementations of the processor 900 may include: 1) a CPU with the special purpose logic 908 being integrated graphics and/or scientific (throughput) logic (which may include one or more cores), and the cores 902A-N being one or more general purpose cores (e.g., general purpose in-order cores, general purpose out-of-order cores, a combination of the two); 2) a coprocessor with the cores 902A-N being a large number of special purpose cores intended primarily for graphics and/or scientific (throughput); and 3) a coprocessor with the cores 902A-N being a large number of general purpose in-order cores. Thus, the processor 900 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 900 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 906, and external memory (not shown) coupled to the set of integrated memory controller units 914. The set of shared cache units 906 may include one or more mid-level caches, such as level 2 (L2), level 3 (L3), level 4 (L4), or other levels of cache, a last level cache (LLC), and/or combinations thereof. While in one embodiment a ring based interconnect unit 912 interconnects the integrated graphics logic 908 (integrated graphics logic 908 is an example of and is also referred to herein as special purpose logic), the set of shared cache units 906, and the system agent unit 910/integrated memory controller unit(s) 914, alternative embodiments may use any number of well-known techniques for interconnecting such units. In one embodiment, coherency is maintained between one or more cache units 906 and cores 902-A-N.

In some embodiments, one or more of the cores 902A-N are capable of multi-threading. The system agent 910 includes those components coordinating and operating cores 902A-N. The system agent unit 910 may include for example a power control unit (PCU) and a display unit. The PCU may be or include logic and components needed for regulating the power state of the cores 902A-N and the integrated graphics logic 908. The display unit is for driving one or more externally connected displays.

The cores 902A-N may be homogenous or heterogeneous in terms of architecture instruction set; that is, two or more of the cores 902A-N may be capable of execution the same instruction set, while others may be capable of executing only a subset of that instruction set or a different instruction set.

Exemplary System Architecture

Figure 10:
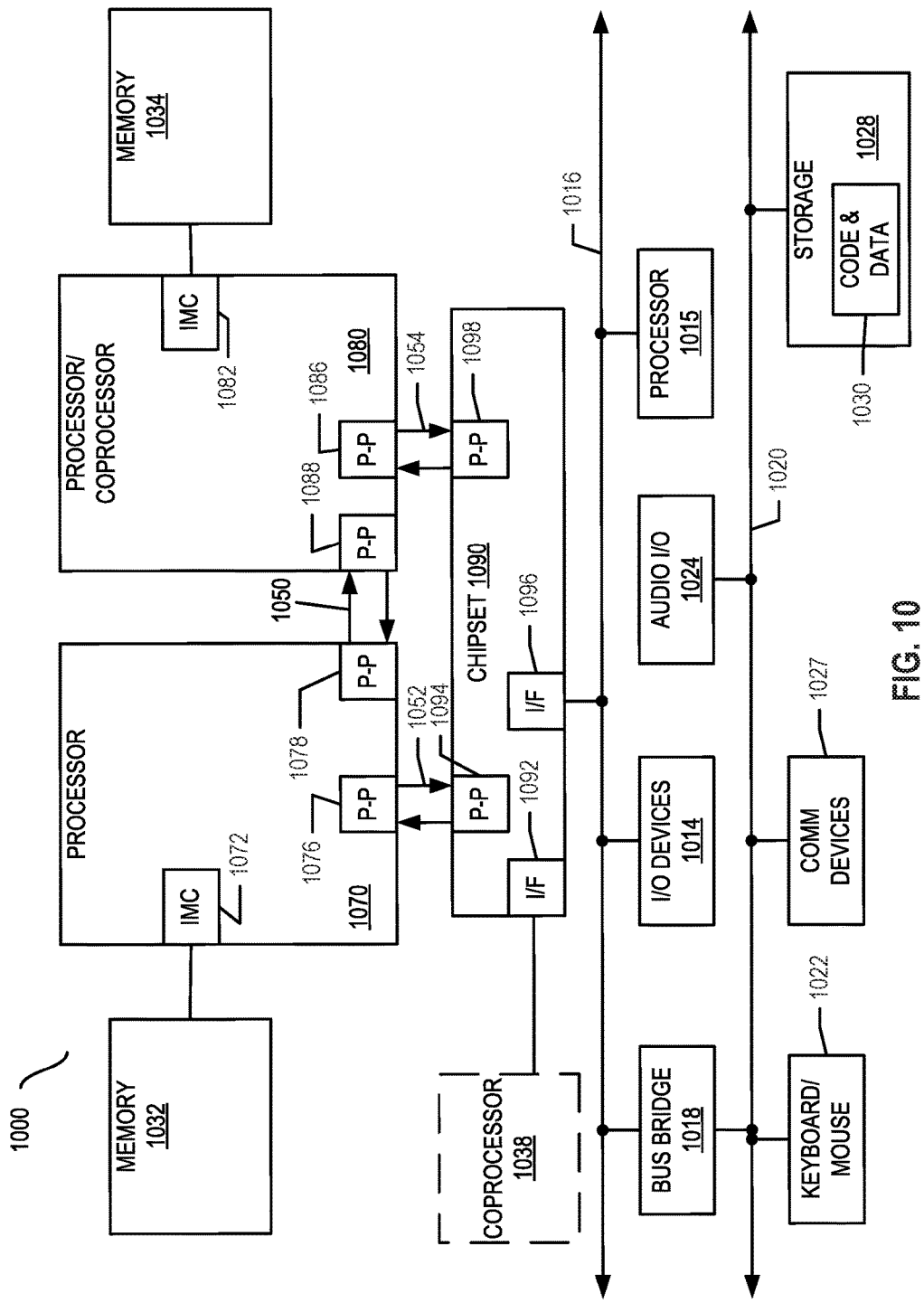
FIG. 10 is a block diagram of a first more specific exemplary system, according to some embodiments.

Referring now to FIG. 10, shown is a block diagram of a first more specific exemplary system 1000 in accordance with an embodiment of the present invention. As shown in FIG. 10, multiprocessor system 1000 is a point-to-point interconnect system, and includes a first processor 1070 and a second processor 1080 coupled via a point-to-point interconnect 1050. Each of processors 1070 and 1080 may be some version of the processor 900.

Processors 1070 and 1080 are shown including integrated memory controller (IMC) units 1072 and 1082, respectively. Processor 1070 also includes as part of its bus controller units point-to-point (P-P) interfaces 1076 and 1078; similarly, second processor 1080 includes P-P interfaces 1086 and 1088. Processors 1070, 1080 may exchange information via a point-to-point (P-P) interface 1050 using P-P interface circuits 1078, 1088. As shown in FIG. 10, IMCs 1072 and 1082 couple the processors to respective memories, namely a memory 1032 and a memory 1034, which may be portions of main memory locally attached to the respective processors.

Processors 1070, 1080 may each exchange information with a chipset 1090 via individual P-P interfaces 1052, 1054 using point to point interface circuits 1076, 1094, 1086, 1098. Chipset 1090 may optionally exchange information with the coprocessor 1038 via a high-performance interface 1092. In one embodiment, the coprocessor 1038 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1090 may be coupled to a first bus 1016 via an interface 1096. In one embodiment, first bus 1016 may be a Peripheral Component Interconnect (PCI) bus, or a bus such as a PCI Express bus or another third generation I/O interconnect bus, although the scope of the present invention is not so limited.

As shown in FIG. 10, various I/O devices 1014 may be coupled to first bus 1016, along with a bus bridge 1018 which couples first bus 1016 to a second bus 1020. In one embodiment, one or more additional processor(s) 1015, such as coprocessors, high-throughput MIC processors, GPGPU's, accelerators (such as, e.g., graphics accelerators or digital signal processing (DSP) units), field programmable gate arrays, or any other processor, are coupled to first bus 1016. In one embodiment, second bus 1020 may be a low pin count (LPC) bus. Various devices may be coupled to a second bus 1020 including, for example, a keyboard and/or mouse 1022, communication devices 1027 and a storage unit 1028 such as a disk drive or other mass storage device which may include instructions/code and data 1030, in one embodiment. Further, an audio I/O 1024 may be coupled to the second bus 1020. Note that other architectures are possible. For example, instead of the point-to-point architecture of FIG. 10, a system may implement a multi-drop bus or other such architecture.

Figure 11:
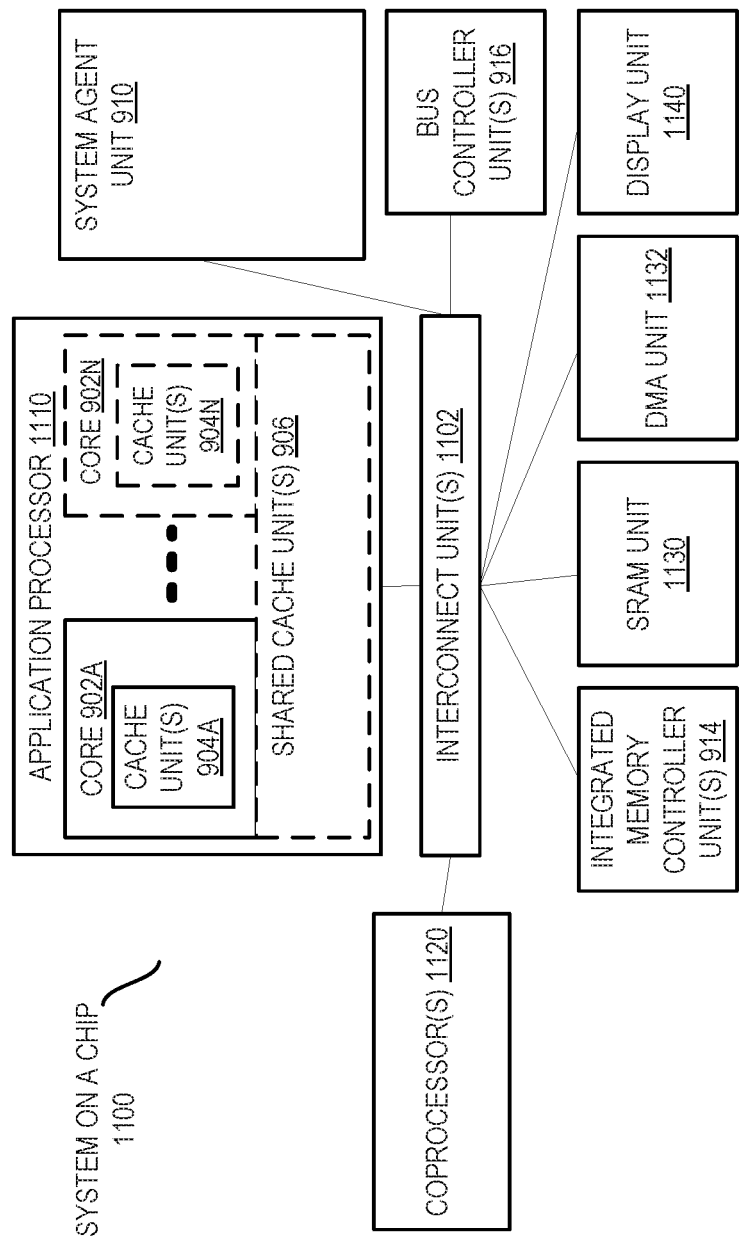
FIG. 11 is a block diagram of a System on a Chip (SoC), according to some embodiments.

Referring now to FIG. 11, shown is a block diagram of a SoC 1100 in accordance with an embodiment of the present invention. Similar elements in FIG. 9 bear like reference numerals. Also, dashed lined boxes are optional features on more advanced SoCs. In FIG. 11, an interconnect unit(s) 1102 is coupled to: an application processor 1110 which includes a set of one or more cores 902A-N, which include cache units 904A-N, and shared cache unit(s) 906; a system agent unit 910; a bus controller unit(s) 916; an integrated memory controller unit(s) 914; a set or one or more coprocessors 1120 which may include integrated graphics logic, an image processor, an audio processor, and a video processor; a static random access memory (SRAM) unit 1130; a direct memory access (DMA) unit 1132; and a display unit 1140 for coupling to one or more external displays. In one embodiment, the coprocessor(s) 1120 include a special-purpose processor, such as, for example, a network or communication processor, compression engine, GPGPU, a high-throughput MIC processor, embedded processor, or the like.

Figure 12:
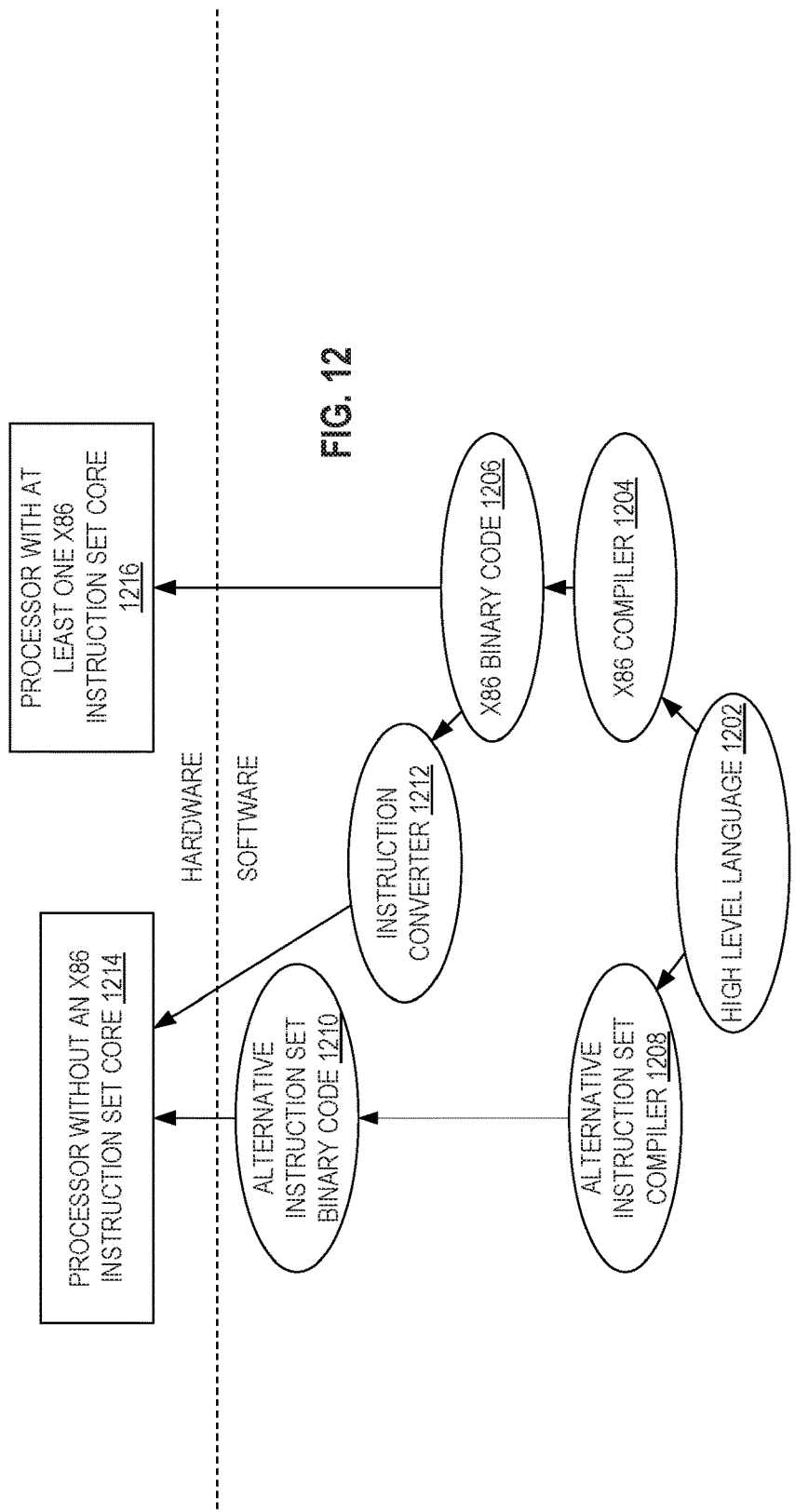
FIG. 12 is a block diagram contrasting the use of a software instruction converter to convert binary instructions in a source instruction set to binary instructions in a target instruction set, according to some embodiments.

FIG. 12 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 12 shows a program in a high level language 1202 may be compiled using an x86 compiler 1204 to generate x86 binary code 1206 that may be natively executed by a processor with at least one x86 instruction set core 1216. The processor with at least one x86 instruction set core 1216 represents any processor that can perform substantially the same functions as a processor with at least one x86 instruction set core by compatibly executing or otherwise processing (1) a substantial portion of the instruction set of the x86 instruction set core or (2) object code versions of applications or other software targeted to run on a processor with at least one x86 instruction set core, in order to achieve substantially the same result as a processor with at least one x86 instruction set core. The x86 compiler 1204 represents a compiler that is operable to generate x86 binary code 1206 (e.g., object code) that can, with or without additional linkage processing, be executed on the processor with at least one x86 instruction set core 1216. Similarly, FIG. 12 shows the program in the high level language 1202 may be compiled using an alternative instruction set compiler 1208 to generate alternative instruction set binary code 1210 that may be natively executed by a processor without at least one x86 instruction set core 1214 (e.g., a processor with cores that execute the MIPS® instruction set of MIPS Technologies of Sunnyvale, Calif. and/or that execute the ARM instruction set of ARM Holdings of Sunnyvale, Calif.). The instruction converter 1212 is used to convert the x86 binary code 1206 into code that may be natively executed by the processor without an x86 instruction set core 1214. This converted code is not likely to be the same as the alternative instruction set binary code 1210 because an instruction converter capable of this is difficult to make; however, the converted code will accomplish the general operation and be made up of instructions from the alternative instruction set. Thus, the instruction converter 1212 represents software, firmware, hardware, or a combination thereof that, through emulation, simulation or any other process, allows a processor or other electronic device that does not have an x86 instruction set processor or core to execute the x86 binary code 1206.

Although some embodiments disclosed herein involve data handling and distribution in the context of hardware execution circuits, other embodiments can be accomplished by way of a data or instructions stored on a non-transitory machine-readable, tangible medium, which, when performed by a machine, cause the machine to perform functions consistent with at least one embodiment. In one embodiment, functions associated with embodiments of the present disclosure are embodied in machine-executable instructions. The instructions can be used to cause a general-purpose or special-purpose processor that is programmed with the instructions to perform the steps of the at least one embodiment. Embodiments disclosed herein are provided as a computer program product or software which includes a machine or computer-readable medium having stored thereon instructions which are used to program a computer (or other electronic devices) to perform one or more operations according to the at least one embodiment. Alternatively, steps of some embodiments are performed by specific hardware components that contain fixed-function logic for performing the steps, or by any combination of programmed computer components and fixed-function hardware components.

Instructions used to program logic to perform the at least one embodiment can be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the non-transitory computer-readable medium includes any type of tangible machine-readable medium suitable for storing or transmitting electronic instructions or information in a form readable by a machine (e.g., a computer).

FURTHER EXAMPLES

Example 1 provides a system including a target circuit, a voltage regulator to provide a variable voltage to the target circuit, a phase-locked loop (PLL) to provide a variable clock to the target circuit, a temperature sensor to sense a temperature of the target circuit; and a control circuit coupled to the target circuit, the voltage regulator, the PLL, and the temperature sensor, wherein the control circuit, in order to perform an in situ characterization and recover at least some guardband, is to set up a characterization environment by setting a temperature, voltage, clock frequency, and workload of the target circuit, execute a plurality of tests on the target circuit, when the target circuit passes the plurality of tests, adjust at least one independent characterization environment variable to increase a likelihood of the target circuit failing the plurality of tests, and repeat the plurality of tests on the target circuit; and when the target circuit fails the plurality of tests, adjust the at least one independent characterization environment variable to decrease a likelihood of the target circuit failing the plurality of tests.

Example 2 includes the subject matter of Example 1, wherein the at least one independent characterization environment variable is one of the variable voltage and the variable clock.

Example 3 includes the subject matter of any one of Examples 1-2, wherein the PLL, the voltage regulator, and the temperature sensor are included in the target circuit.

Example 4 includes the subject matter of any one of Examples 1-3, wherein the control circuit includes a network interface and wherein the control circuit is further to receive and respond to commands from a network, the system further including a cloud-based manager coupled to the control circuit via the network interface, wherein the cloud-based manager is to manage the control circuit.

Example 5 includes the subject matter of any one of Examples 1-4, wherein the control circuit is further to repeat the in situ characterization and guardband recovery at regular intervals during normal operation of the target circuit.

Example 6 includes the subject matter of any one of Examples 1-5, wherein the target circuit is on a different power rail than the control circuit, and wherein the control circuit is further to power cycle the target circuit when the target circuit fails the plurality of tests.

Example 7 includes the subject matter of any one of Examples 1-6, wherein the control circuit and the target circuit are disposed on a same die.

Example 8 includes the subject matter of any one of Examples 1-7, wherein the control circuit and the target circuit are disposed on a same printed circuit board (PCB).

Example 9 provides a method to be performed by a control circuit to characterize, in situ, a target circuit to recover at least some guardband, the method including setting a temperature, a power rail voltage, a clock frequency, and a workload of the target circuit, wherein the power rail voltage includes a guardband, executing a plurality of tests on the target circuit, determining whether the target circuit passed the plurality of tests, when the target circuit is determined to have passed the plurality of tests, adjusting the power rail voltage to increase a likelihood of the target circuit failing the plurality of tests, and repeating the plurality of tests on the target circuit; and when the target circuit is determined to have failed the plurality of tests, adjusting the power rail to decrease the likelihood of the target circuit failing the plurality of tests.

Example 10 includes the subject matter of Example 9, wherein the clock frequency includes a guardband, and wherein the control circuit is further to when the target circuit passes the plurality of tests, adjust the clock frequency to increase a likelihood of the target circuit failing the plurality of tests, and repeating the plurality of tests on the target circuit; and when the target circuit fails the plurality of tests, adjust the clock frequency to decrease the likelihood of the target circuit failing the plurality of tests.

Example 11 includes the subject matter of any one of Examples 9-10, wherein the target circuit is on a different power rail than the control circuit, and wherein the control circuit is further to power cycle the target circuit when the target circuit fails the plurality of tests.

Example 12 includes the subject matter of any one of Examples 9-11, wherein the control circuit is to cause results of executing the plurality of tests to be discarded and regenerated when the target circuit fails the plurality of tests.

Example 13 includes the subject matter of any one of Examples 9-12, further including the control circuit repeating the in situ characterization and guardband recovery at regular intervals during normal operation of the target circuit.

Example 14 includes the subject matter of Example 9, further including the control circuit responding to a trigger by repeating the in situ characterization and guardband recovery, wherein the trigger is generated when the target circuit executes a computational algorithm that tolerates some erroneous results, and wherein the percentage of erroneous results exceeds an error threshold.

Example 15 includes the subject matter of Example 9, wherein the control circuit includes a network interface and wherein the method further includes the control circuit receiving and responding to commands from a cloud-based manager issuing commands over the network to manage the control circuit.

Example 16 provides a non-transitory computer-readable storage medium having stored therein instructions, which when executed by a control circuit coupled to a target circuit, a controllable voltage source to provide variable voltage to the target circuit, a controllable clock generator to provide a variable clock to the target circuit, and a temperature sensor to sense a temperature of the target circuit, causes the control circuit to conduct an in situ characterization of the target circuit and recover at least some guardband by setting a temperature, a power rail voltage, a clock frequency, and a workload of the target circuit, wherein the power rail voltage includes a guardband, executing a plurality of tests on the target circuit, determining whether the target circuit passed the plurality of tests, when the target circuit is determined to have passed the plurality of tests, adjusting the power rail voltage to increase a likelihood of the target circuit failing the plurality of tests, and repeating the plurality of tests on the target circuit; and when the target circuit is determined to have failed the plurality of tests, adjusting the power rail to decrease the likelihood of the target circuit failing the plurality of tests.

Example 17 includes the subject matter of Example 16, wherein the clock frequency includes a guardband, and wherein the control circuit is further to when the target circuit passes the plurality of tests, adjust the clock frequency to increase a likelihood of the target circuit failing the plurality of tests, and repeat the plurality of tests on the target circuit; and when the target circuit fails the plurality of tests, adjust the clock frequency to decrease the likelihood of the target circuit failing the plurality of tests.

Example 18 includes the subject matter of Examples 16-17, wherein the target circuit is on a different power rail than the control circuit, and wherein the control circuit is further to power cycle the target circuit when the target circuit fails the plurality of tests.

Example 19 includes the subject matter of Examples 16-18, wherein the target circuit is on a different power rail than the control circuit, and wherein the control circuit is to discard execution results when the target circuit fails the plurality of tests.

Example 20 includes the subject matter of Examples 16-19, further including the control circuit repeating, upon a passage of a predetermined amount of time, the in situ characterization to recover at least some guardband.

Example 21 provides a machine readable medium including code, when executed, to cause a machine to perform the method of any one of Examples 9-15.

Example 22 provides an apparatus including a target circuit, a voltage regulator to provide a variable voltage to the target circuit, a phase-locked loop (PLL) to provide a variable clock to the target circuit, a temperature sensor to sense a temperature of the target circuit; and a control circuit coupled to the target circuit, the voltage regulator, the PLL, and the temperature sensor, wherein the control circuit, in order to perform an in situ characterization and recover at least some guardband, is to set up a characterization environment by setting a temperature, voltage, clock frequency, and workload of the target circuit, execute a plurality of tests on the target circuit, when the target circuit passes the plurality of tests, adjust at least one independent characterization environment variable to increase a likelihood of the target circuit failing the plurality of tests, and repeat the plurality of tests on the target circuit; and when the target circuit fails the plurality of tests, adjust the at least one independent characterization environment variable to decrease a likelihood of the target circuit failing the plurality of tests.

Example 23 includes the subject matter of Example 22, wherein the at least one independent characterization environment variable is one of the variable voltage and the variable clock.

Example 24 includes the subject matter of any one of Examples 22-23, wherein the PLL, the voltage regulator, and the temperature sensor are included in the target circuit.

Example 25 includes the subject matter of any one of Examples 22-24, wherein the control circuit includes a network interface and wherein the control circuit is further to receive and respond to commands from a network, the apparatus further including a cloud-based manager coupled to the control circuit via the network interface, wherein the cloud-based manager is to manage the control circuit.

Example 26 includes the subject matter of any one of Examples 22-25, wherein the control circuit is further to repeat the in situ characterization and guardband recovery at regular intervals during normal operation of the target circuit.

Example 27 includes the subject matter of any one of Examples 22-26, wherein the target circuit is on a different power rail than the control circuit, and wherein the control circuit is further to power cycle the target circuit when the target circuit fails the plurality of tests.

Example 28 includes the subject matter of any one of Examples 22-27, wherein the control circuit and the target circuit are disposed on a same die.

Example 29 includes the subject matter of any one of Examples 22-28, wherein the control circuit and the target circuit are disposed on a same printed circuit board (PCB).

Example 30 provides an apparatus including a target circuit, means for providing a variable voltage to the target circuit, means for providing a variable clock to the target circuit, means for sensing a temperature of the target circuit; and a control circuit coupled to the target circuit, the voltage regulator, the PLL, and the temperature sensor, wherein the control circuit, in order to perform an in situ characterization and recover at least some guardband, is to set up a characterization environment by setting a temperature, voltage, clock frequency, and workload of the target circuit, execute a plurality of tests on the target circuit, when the target circuit passes the plurality of tests, adjust at least one independent characterization environment variable to increase a likelihood of the target circuit failing the plurality of tests, and repeat the plurality of tests on the target circuit; and when the target circuit fails the plurality of tests, adjust the at least one independent characterization environment variable to decrease a likelihood of the target circuit failing the plurality of tests.

Example 31 includes the subject matter of Example 30, wherein the control circuit is further to repeat the in situ characterization and guardband recovery at regular intervals during normal operation of the target circuit.

Although some embodiments disclosed herein involve data handling and distribution in the context of hardware execution circuits, other embodiments can be accomplished by way of a data or instructions stored on a non-transitory machine-readable, tangible medium, which, when performed by a machine, cause the machine to perform functions consistent with at least one embodiment. In one embodiment, functions associated with embodiments of the present disclosure are embodied in machine-executable instructions. The instructions can be used to cause a general-purpose or special-purpose processor that is programmed with the instructions to perform the steps of the at least one embodiment. Embodiments disclosed herein are provided as a computer program product or software which includes a machine or computer-readable medium having stored thereon instructions which are used to program a computer (or other electronic devices) to perform one or more operations according to the at least one embodiment. Alternatively, steps of some embodiments are performed by specific hardware components that contain fixed-function logic for performing the steps, or by any combination of programmed computer components and fixed-function hardware components.

Instructions used to program logic to perform the at least one embodiment can be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the non-transitory computer-readable medium includes any type of tangible machine-readable medium suitable for storing or transmitting electronic instructions or information in a form readable by a machine (e.g., a computer).

What is claimed is:

1. A system comprising:
 a target circuit to which are coupled a voltage regulator to provide a variable voltage, a phase-locked loop (PLL) to provide a variable clock, and a temperature sensor; and
 a control circuit coupled to the target circuit, the voltage regulator, the PLL, and the temperature sensor, wherein the control circuit, in order to perform an in situ characterization and recover at least some guardband, is to:
 set up a characterization environment by setting a temperature, voltage, clock frequency, and workload of the target circuit;
 execute a plurality of tests on the target circuit; and
 when the target circuit passes the plurality of tests, adjust at least one independent characterization environment variable to increase a likelihood of the target circuit failing the plurality of tests, and repeat the plurality of tests on the target circuit; and when the target circuit fails the plurality of tests, adjust the at least one independent characterization environment variable to decrease a likelihood of the target circuit failing the plurality of tests,
 wherein the target circuit is on a different power rail than the control circuit, and wherein the control circuit is further to power cycle the target circuit when the target circuit fails the plurality of tests.

2. The system of claim 1, wherein the at least one independent characterization environment variable is one of the variable voltage and the variable clock.

3. The system of claim 1, wherein the PLL, the voltage regulator, and the temperature sensor are included in the target circuit.

4. The system of claim 1, wherein the control circuit comprises a network interface and wherein the control circuit is further to receive and respond to commands from a network, the system further comprising a cloud-based manager coupled to the control circuit via the network interface, wherein the cloud-based manager is to manage the control circuit.

5. The system of claim 1, wherein the control circuit is further to repeat the in situ characterization and guardband recovery at regular intervals during normal operation of the target circuit.

6. The system of claim 1, wherein the different power rail isolates the control circuit from the target circuit such that a failure or need to reset the target circuit does not interfere with a supply voltage used by the control circuit.

7. The system of claim 1, wherein the control circuit and the target circuit are disposed on a same die.

8. The system of claim 1, wherein the control circuit and the target circuit are disposed on a same printed circuit board (PCB).

9. A method to be performed by a control circuit to characterize, in situ, a target circuit to recover at least some guardband, the method comprising:
 setting a temperature, a power rail voltage, a clock frequency, and a workload of the target circuit, wherein the power rail voltage includes a guardband;
 executing a plurality of tests on the target circuit;
 when the target circuit is determined to have passed the plurality of tests, adjusting the power rail voltage to increase a likelihood of the target circuit failing the plurality of tests, and repeating the plurality of tests on the target circuit; and
 when the target circuit is determined to have failed the plurality of tests, adjusting the power rail to decrease the likelihood of the target circuit failing the plurality of tests;
 wherein the target circuit is on a different power rail than the control circuit, and
 wherein the control circuit is further to power cycle the target circuit when the target circuit fails the plurality of tests.

10. The method of claim 9,
 wherein the clock frequency includes a guardband, and
 wherein the control circuit is further to:
 when the target circuit passes the plurality of tests, adjust the clock frequency to increase a likelihood of the target circuit failing the plurality of tests, and repeating the plurality of tests on the target circuit; and
 when the target circuit fails the plurality of tests, adjust the clock frequency to decrease the likelihood of the target circuit failing the plurality of tests.

11. The method of claim 9, wherein the different power rail isolates the control circuit from the target circuit such that a failure or need to reset the target circuit does not interfere with a supply voltage used by the control circuit.

12. The method of claim 9, wherein the control circuit is to cause results of executing the plurality of tests to be discarded and regenerated when the target circuit fails the plurality of tests.

13. The method of claim 9, further comprising the control circuit repeating the in situ characterization and guardband recovery at regular intervals during normal operation of the target circuit.

14. The method of claim 9, further comprising the control circuit responding to a trigger by repeating the in situ characterization and guardband recovery, wherein the trigger is generated when the target circuit executes a computational algorithm that tolerates some erroneous results, and wherein a percentage of erroneous results exceeds an error threshold.

15. The method of claim 9, wherein the control circuit comprises a network interface and wherein the method further comprises the control circuit receiving and responding to commands from a cloud-based manager issuing commands over the network to manage the control circuit.

16. A non-transitory machine-readable medium containing instructions to which a control circuit coupled to a target circuit, a voltage source to provide variable voltage to the target circuit, a clock generator to provide a variable clock to the target circuit, and a temperature sensor to sense a temperature of the target circuit are to respond by conducting an in situ characterization of the target circuit and recovering at least some guardband by:
   setting a temperature, a power rail voltage, a clock frequency, and a workload of the target circuit, wherein the power rail voltage includes a guardband;
   executing a plurality of tests on the target circuit;
   when the target circuit is determined to have passed the plurality of tests, adjusting the power rail voltage to increase a likelihood of the target circuit failing the plurality of tests, and repeating the plurality of tests on the target circuit; and
   when the target circuit is determined to have failed the plurality of tests, adjusting the power rail to decrease the likelihood of the target circuit failing the plurality of tests;
   wherein the target circuit is on a different power rail than the control circuit, and
   wherein the control circuit is further to power cycle the target circuit when the target circuit fails the plurality of tests.

17. The non-transitory computer-readable storage medium of claim 16,
   wherein the clock frequency includes a guardband, and
   wherein the control circuit is further to:
   when the target circuit passes the plurality of tests, adjust the clock frequency to increase a likelihood of the target circuit failing the plurality of tests, and repeat the plurality of tests on the target circuit; and
   when the target circuit fails the plurality of tests, adjust the clock frequency to decrease the likelihood of the target circuit failing the plurality of tests.

18. The non-transitory computer-readable storage medium of claim 16, wherein the different power rail isolates the control circuit from the target circuit such that a failure or need to reset the target circuit does not interfere with a supply voltage used by the control circuit.

19. The non-transitory computer-readable storage medium of claim 16, wherein the target circuit is on a different power rail than the control circuit, and wherein the control circuit is to discard execution results when the target circuit fails the plurality of tests.

20. The non-transitory computer-readable storage medium of claim 16, further comprising the control circuit repeating, upon a passage of a predetermined amount of time, the in situ characterization to recover at least some guardband.

* * * * *